United States Patent
Mimura

[11] Patent Number: 5,920,226
[45] Date of Patent: Jul. 6, 1999

[54] INTERNAL VOLTAGE GENERATOR WITH REDUCED POWER CONSUMPTION

[75] Inventor: Akimitsu Mimura, Ome, Japan

[73] Assignee: Hitachi, Ltd., Tokyo, Japan

[21] Appl. No.: 09/050,884

[22] Filed: Mar. 31, 1998

[30] Foreign Application Priority Data

Mar. 31, 1997 [JP] Japan ................................. 9-096654

[51] Int. Cl.$^6$ ....................................................... G05F 3/02
[52] U.S. Cl. ........................... 327/537; 327/535; 327/536
[58] Field of Search .................................. 327/534, 535, 327/536, 537

[56] References Cited

U.S. PATENT DOCUMENTS

| | | | |
|---|---|---|---|
| 5,227,675 | 7/1993 | Taguchi | 327/530 |
| 5,247,208 | 9/1993 | Nakayama | 327/534 |
| 5,619,161 | 4/1997 | Novof et al. | 327/535 |
| 5,629,646 | 5/1997 | Menezes et al. | 327/536 |
| 5,642,072 | 6/1997 | Miyamoto et al. | 327/535 |
| 5,808,505 | 9/1998 | Tsukada | 327/536 |
| 5,821,805 | 10/1998 | Jinbo | 327/537 |
| 5,838,189 | 11/1998 | Jeon | 327/537 |

FOREIGN PATENT DOCUMENTS

| | | |
|---|---|---|
| A-1-207962 | 8/1989 | Japan. |
| A-2-137254 | 5/1990 | Japan. |
| A-4-87364 | 3/1992 | Japan. |
| A-5-53667 | 3/1993 | Japan. |
| A-7-130171 | 5/1995 | Japan. |

*Primary Examiner*—Terry D. Cunningham
*Assistant Examiner*—Maria Hasanzadah
*Attorney, Agent, or Firm*—Antonelli, Terry, Stout & Kraus, LLP

[57] ABSTRACT

A first periodic pulse is rectified to generate an internal voltage by a charge pump circuit. A level detector is provided for detecting whether or not the internal voltage reaches a desired level. The charge pump circuit is controlled by a controller in accordance with the detection signal so that the internal voltage may take the desired level. A switch element switched by a second periodic pulse is provided in the current path of the level detector. A leakage current path for allowing a lower electric current than the electric current to flow through the former current path is provided between the output terminal of the charge pump circuit and a predetermined power supply terminal.

38 Claims, 11 Drawing Sheets

INTERNAL VOLTAGE GENERATOR WITH REDUCED POWER CONSUMPTION

BACKGROUND OF THE INVENTION

The present invention relates to a semiconductor integrated circuit device and, more particularly, to a technique which is effective when applied to an internal voltage generator, such as a substrate back bias voltage generator, in a dynamic RAM (Random Access Memory), for example.

Such a dynamic RAM, which is equipped with a pumping circuit for generating a substrate back bias voltage, is disclosed in Japanese Patent Laid-Opens Nos. 7-130171/1995, 1-207962/1989, 2-137254/1990, 5-53667/1993 and 4-87364/1992.

SUMMARY OF THE INVENTION

In order to stabilize the internal voltage and to reduce the power consumption of an internal voltage of the type described above, an intermittently active level detector is provided to control the operation of the charge pump circuit so that the substrate voltage may be maintained at a desired voltage level. However, our investigations have revealed that the stability of the internal voltage is liable to deteriorate when the level detector is not in operation.

An object of the present invention is to provide a semiconductor integrated circuit device which is equipped with an internal voltage generator that is capable of reducing the power consumption and stabilizing the operation of the device. Another object of the invention is to provide a semiconductor integrated circuit device which is equipped with an internal voltage generator that is capable of reducing the power consumption and stabilizing the operation with a simple construction. The foregoing and other objects and novel features of the invention will become apparent from the following description to be made with reference to the accompanying drawings.

Here will be briefly described a representative features of the present invention as disclosed herein. Specifically, a first periodic pulse is rectified to generate an internal voltage using a charge pump circuit; a level detector is provided for detecting whether or not the internal voltage reaches a desired level; the charge pump circuit is controlled by a controller in accordance with the detection signal of the level detector so that the internal voltage may take a desired level; a switch element switched by a second periodic pulse is provided in a current path of the level detector; and a leakage current path is provided for causing a lower electric current to flow than the current flowing through the former current path.

DETAILED DESCRIPTION OF THE INVENTION

Figure 1:
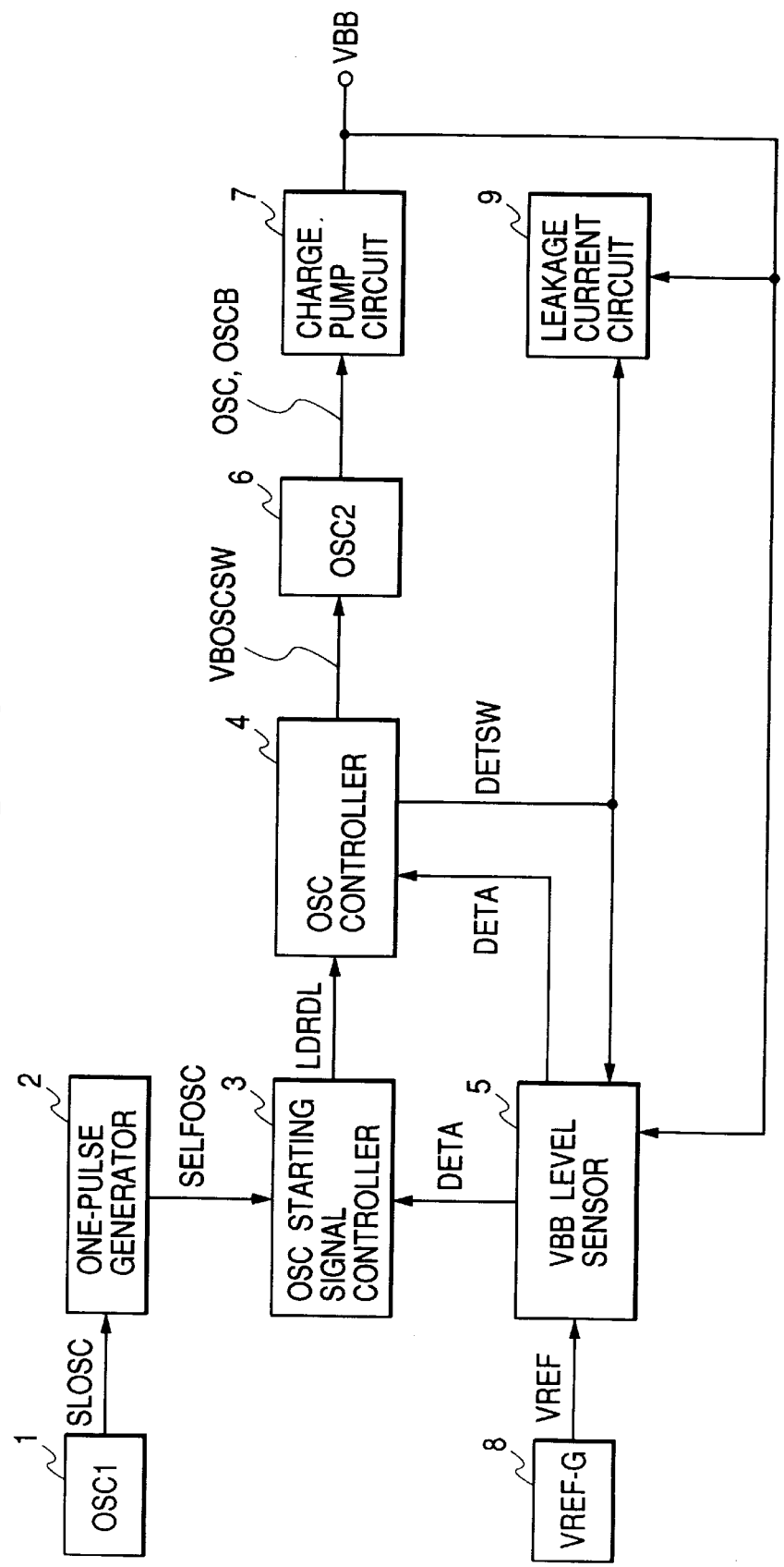
FIG. 1 is a block diagram showing one embodiment of a substrate back bias voltage generator according to the invention.

FIG. 1 is a block diagram showing one embodiment of a substrate back bias voltage generator according to the invention. This substrate back bias voltage generator feeds a back bias voltage $V_{BB}$ at a negative level to a P-type well region or P-type substrate where a memory array of a dynamic RAM, which will be described hereinafter, is formed. The substrate back bias voltage generator is formed together with the other circuit blocks of the dynamic RAM over one semiconductor substrate of single crystal silicon by a known technique of manufacturing semiconductor integrated circuits.

An oscillator (OSC1) 1 oscillates at a relatively low frequency of about 100 KHz. An oscillatory pulse SLOSC at this low frequency is fed to a one-pulse generator 2. In synchronism with the timing of the change in the low-frequency pulse SLOSC from one level to the other, the one-pulse generator 2 generates one pulse SELFOSC having a width of about one-hundredth of the pulse width of the pulse SLOSC. This one pulse SELFOSC is fed to an OSC starting signal controller 3.

Upon receiving the one pulse SELFOSC and a level detection signal DETA of a $V_{BB}$ level sensor 5, the OSC starting signal controller 3 generates a control signal LDRDL. The signal LDRDL and the level detection signal DETA of the $V_{BB}$ level sensor 5 are fed to an OSC controller 4. Upon receiving the signal LDRDL, the OSC controller 4 generates a signal DETSW for activating the $V_{BB}$ level sensor 5.

If the $V_{BB}$ level sensor 5 is activated by the signal DETSW and it is determined that the level of the level detection signal DETA is lower in absolute value than the set value of the voltage $V_{BB}$, the OSC controller 4 generates an oscillation control signal VBOSCSW to activate an oscillator (OSC2) 6. As a result, an oscillation pulse OSC and its inverted signal OSCB are fed to a charge pump circuit 7 to change the substrate voltage $V_{BB}$ to a negative level by extracting an electric current therefrom. If it is determined that the level of the level detection signal DETA of the $V_{BB}$ level sensor 5 activated by the signal DETSW is higher in absolute value than the set value of the substrate voltage $V_{BB}$, the OSC controller 4 will not generate the oscillation control signal VBOSCSW. In other words, even if the $V_{BB}$ level sensor is kept activated for a constant period by the oscillation pulse of the oscillator 1, as described above, the charge pump circuit 7 is not activated if the substrate voltage $V_{BB}$ is at a desired potential level.

In this embodiment, if it is determined that the level of the level detection signal DETA of the $V_{BB}$ level sensor 5 is lower in absolute value than the set value $V_{BB}$, the signal LDRDL is kept at a high level in place of the pulse SELFOSC generated by the one-pulse generator 2, and the signal DETA for activating the $V_{BB}$ level sensor 5 is continuously generated. In short, the OSC starting signal controller 3, the OSC controller 4, and the $V_{BB}$ level sensor 5 constitute a feedback loop to establish a latch state until it is determined that the level of the level detection signal DETA of $V_{BB}$ level sensor 5 is higher in the absolute value than the set value $V_{BB}$.

By providing such a control signal latch loop, the charge pump circuit 7 is activated through the oscillator (OSC2) 6 till the desired level $V_{BB}$ is reached if the $V_{BB}$ level sensor 5 is activated and it is determined that the level of the level detection signal DETA is lower in absolute value than the set $V_{BB}$ value. As a result, each time the pulses OSC and OSCB are generated by the oscillator (OSC2) 6, the charge pump operation is effected to extract the substrate voltage $V_{BB}$. If the level of the level detection signal DETA of the $V_{BB}$ level sensor 5 reaches the set value of the substrate voltage $V_{BB}$, the output signal LDRDL of the OSC starting signal controller 3 changes and the signal DETSW changes through the OSC controller 4 to inactivate the $V_{BB}$ level sensor 5 and to stop the oscillation of the oscillator (OSC2) 6.

By means of the signal DETSW, the level detection signal DETA of the $V_{BB}$ level sensor 5 is forcedly set at the same level as that of the case in which it reaches in absolute value the set value $V_{BB}$. As a result, before the next timing at which the output pulse SELFOSC of the one-pulse generator 2 arrives, the OSC controller 4 is controlled by the signal LDRDL in accordance with the level of the signal SELFOSC to keep the signals DETSW and VBOSCSW in the aforementioned states. In short, the $V_{BB}$ level sensor 5 is inactivated, and the oscillator (OSC2) 6 and the charge pump circuit 7 are inactivated.

When the $V_{BB}$ level sensor 5 and the charge pump circuit 7 are inactivated, as described above, the substrate voltage $V_{BB}$ will lose its current path, and there arises a problem that a potential fluctuation is liable to occur due to the capacitative coupling with the other power supply line, although the current consumption is low. Thus, there is provided a leakage current circuit 9. This leakage current circuit 9 is connected between the substrate voltage $V_{BB}$ and a suitable power supply terminal, causing a weak current to flow. This leakage current is set at a value smaller than the current flowing through the substrate when the $V_{BB}$ level sensor 5 is in operation and is needed to reduce the aforementioned potential fluctuation.

The leakage current circuit 9 is provided for reducing the potential fluctuation due to the capacitative coupling when the substrate potential $V_{BB}$ is brought into a floating state, and is activated complementarily with the $V_{BB}$ level sensor 5 by the control signal DETA of the $V_{BB}$ level sensor 5. In short, when the $V_{BB}$ level sensor 5 is activated by the signal DETA, the leakage current circuit 9 is inactivated. When the $V_{BB}$ level sensor 5 is inactivated, the leakage current circuit 9 is activated.

A reference voltage generator (VREF-G) 8 feeds two transistors having different emitter areas with the same electric current to generate a constant voltage VREF by making use of the base-to-emitter voltage difference corresponding to the emitter current densities. This constant voltage VREF is fed to the $V_{BB}$ level sensor 5 and the constant current generated by making use of the constant voltage VREF is employed as a bias current for a current path for detecting the $V_{BB}$ potential of the $V_{BB}$ level sensor 5 and for an amplifier for amplifying the detection signal. By using this constant current, the $V_{BB}$ level sensor 5 can be activated stably with a low power consumption. This constant voltage VREF can also be used as a voltage for setting the leakage current of the leakage current circuit 9, although the invention is not especially limited thereto.

Figure 2:
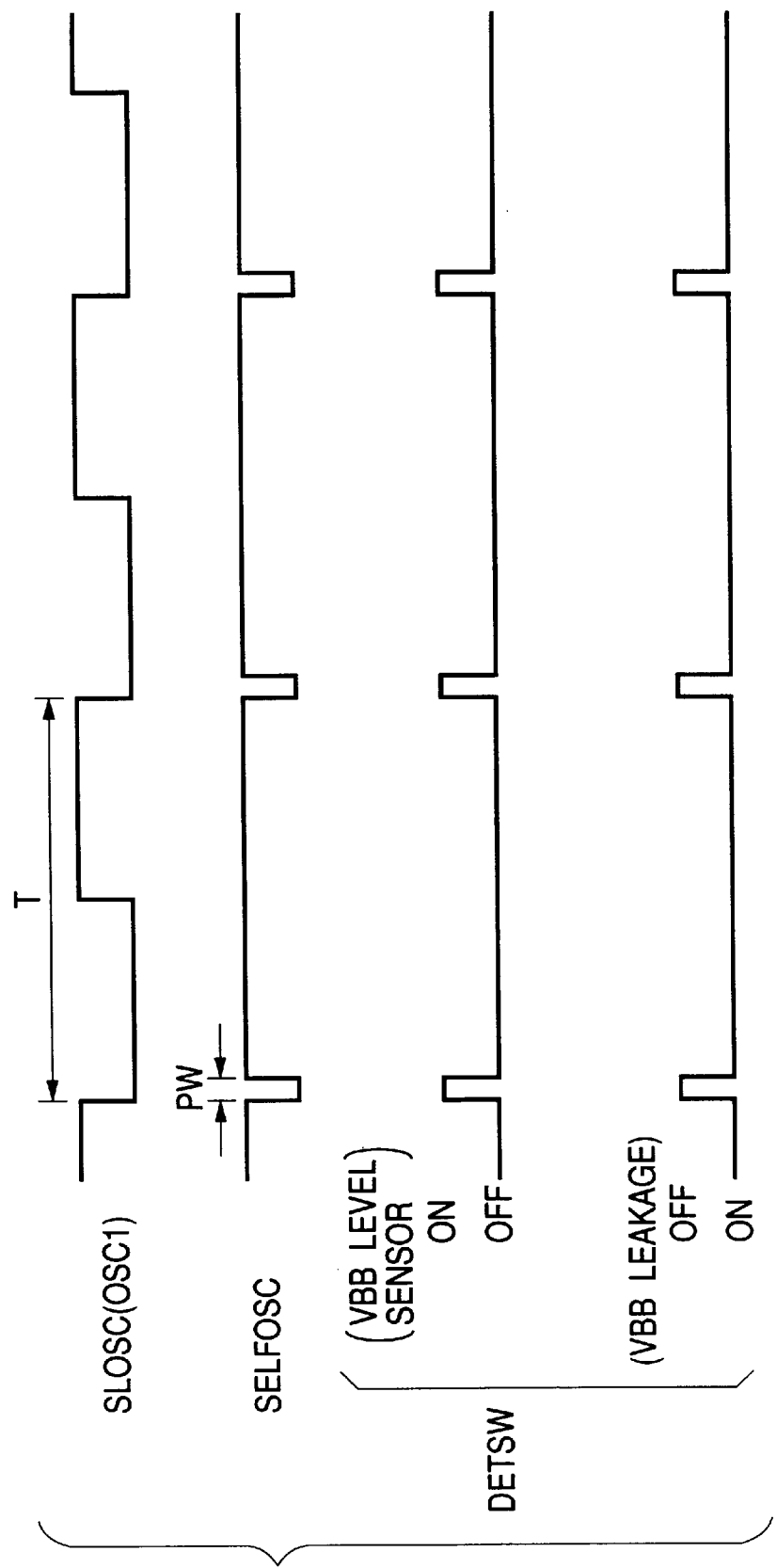
FIG. 2 is a timing chart for illustrating one example of the operation of a substrate back bias voltage generator according to the invention.

FIG. 2 is a timing chart for illustrating one example of the operation of a substrate back bias voltage generator according to the invention. The oscillator (OSC1) 1 generates the oscillatory pulse SLOSC. This oscillatory pulse SLOSC is generated at a low frequency (about 100 kHz), one period T being as low as about 10 μs. In the one-pulse generator 2, a pulse having a width PW of about 0.1 μs is generated at a timing where the oscillatory pulse SLOSC changes from the high level to the low level. As a result, the one-pulse generator 2 generates the pulse SELFOSC, the period of which is reduced to about one-hundredth of one period of the oscillatory pulse SLOSC.

The control circuit generates the control signal DETSW corresponding to the pulse SELFOSC. For the high level period of the control signal DETSW, the $V_{BB}$ level sensor is turned on (activated), and the $V_{BB}$ leakage current circuit is turned off (inactivated). In this embodiment, only while the signal DETSW is at the high level, the $V_{BB}$ level sensor 5 is activated to control the oscillator (OSC2) 6 and the charge pump circuit 7 according to its detection signal.

Specifically, if the $V_{BB}$ level sensor 5 indicates that the substrate voltage $V_{BB}$ is lower in absolute value than the set value, the oscillator 6 is activated by the detection signal, and the substrate voltage $V_{BB}$ is increased in the negative direction by the charge pump circuit 7. In this embodiment, therefore, while the control signal DETSW is at the high level, the oscillation frequency of the oscillator (OSC2) 6 and the current feeding ability of the charge pump circuit 7 are determined so that the substrate voltage $V_{BB}$ may take the set value. If it is determined that the substrate voltage $V_{BB}$ is higher in absolute value than the set value, the oscillator 6 is inactivated by the operation of the charge pump circuit 7. If the substrate voltage $V_{BB}$ is at the set $V_{BB}$ value when the control signal DETSW changes to the high level, it goes without saying that the oscillator 6 remains inactive and the charge pump circuit 7 does not act.

By this construction, the time periods for which the $V_{BB}$ level sensor, the oscillator (OSC2) 6 and the charge pump circuit are active can be drastically shortened in accordance with the pulse width PW of the pulse SELFOSC. Compared with a conventional $V_{BB}$ level sensor which is used in a steady operation, the current consumption of the $V_{BB}$ level sensor of the invention having the same structure as that of the conventional one can be reduced to one-hundredth of that of the prior art.

Figure 3:
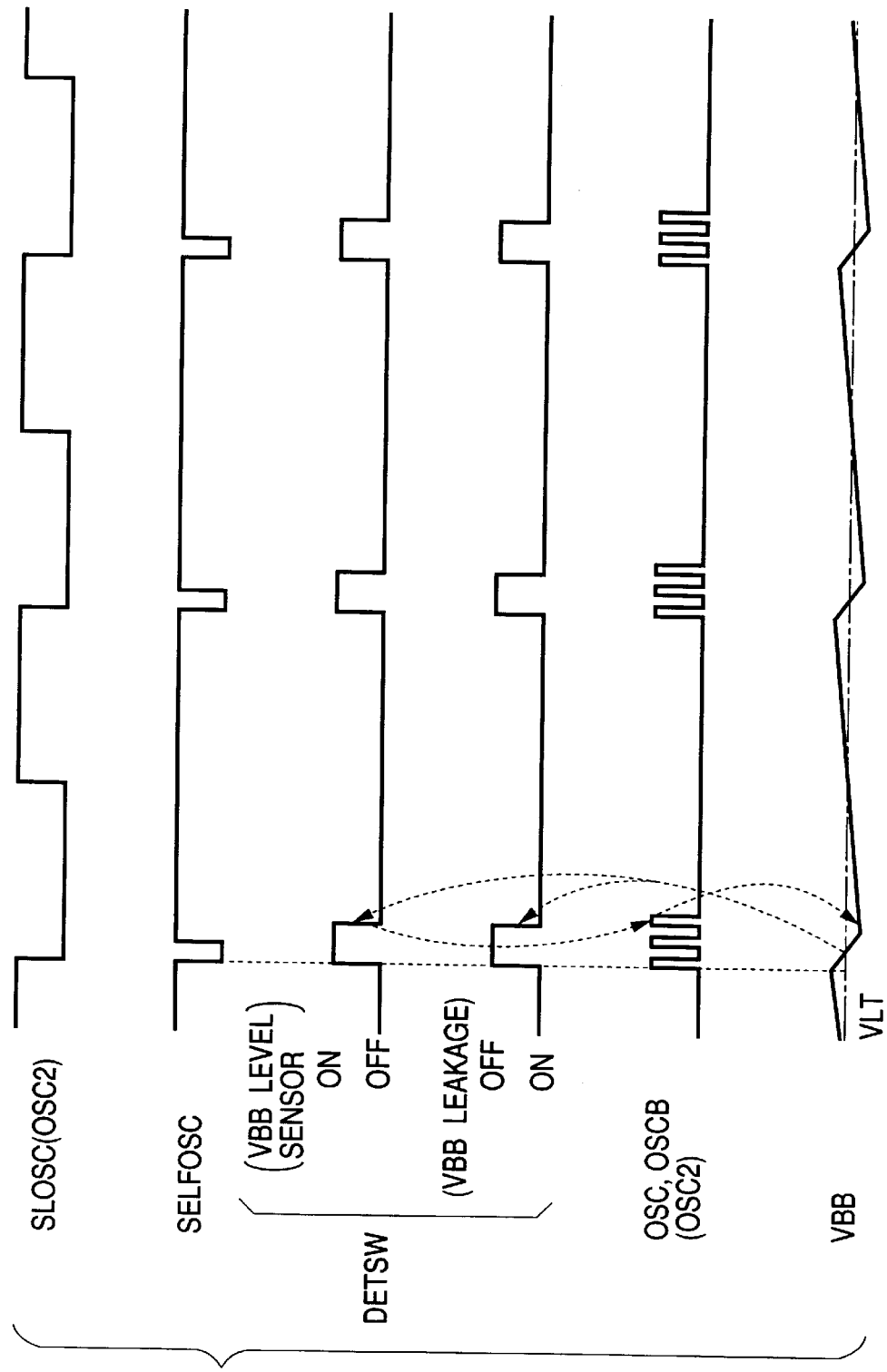
FIG. 3 is a timing chart for illustrating one example of the operation of a substrate back bias voltage generator shown in FIG. 1.

FIG. 3 is a timing chart for illustrating one example of the operation of a substrate back bias voltage generator shown in FIG. 1. The oscillator (OSC1) 1 generates the oscillatory pulse SLOSC. This oscillatory pulse SLOSC is generated at a low frequency (about 100 kHz), like before, one period T being as low as about 10 $\mu$s, although the invention is not especially limited thereto. In the one-pulse generator 2, a pulse having a width PW of about 0.1 $\mu$s is generated at a timing at which the oscillatory pulse SLOSC changes from the high level to the low level.

In the OSC starting signal controller 3, the control signal LDRDL is generated in response to the low level of the one pulse SELFOSC. In the OSC controller 4, the signal DETSW is changed to the high level in response to the signal LDRDL. In response to the high level of the signal DETSW, the $V_{BB}$ level sensor 5 is activated. If it is determined that the substrate voltage $V_{BB}$ is lower in absolute value than a set value VLT, the control signal LDRDL is generated in place of the low level of the one pulse SELFOSC to keep the signal DETSW of the OSC controller 4 at the high level. In short, even if the one pulse SELFOSC returns to the high level, the signal DETSW is kept at the high level to activate the $V_{BB}$ level sensor 5 if the detection signal DETA is at the high level.

The OSC controller 4 generates an oscillation control signal VBOSCSW to activate the oscillator (OSC2) 6. As a result, the charge pump circuit 7 is fed with the oscillatory pulse OSC and its inverted signal OSCB, electric current is extracted from the substrate voltage $V_{BB}$, and the voltage is changed in the negative potential direction. If it is determined that the level detection signal DETA of the $V_{BB}$ level sensor 5 activated by the signal DETSW is higher in the absolute value than the set value VLT, the OSC controller 4 does not generate the oscillation control signal VBOSCSW. In short, even if the $V_{BB}$ level sensor 5 is activated at a constant cycle by the oscillatory pulse of the oscillator 1, the charge pump circuit 7 is not activated if the substrate voltage $V_{BB}$ is at the desired potential. At the instant when the one pulse SELFOSC returns to the high level, the $V_{BB}$ level sensor 5 is also inactivated.

In the OSC starting signal controller 3 of this embodiment, if the $V_{BB}$ level sensor 5 indicates that the substrate voltage $V_{BB}$ is lower in absolute value than the set value VLT, in response to the high level of the level detection signal DETA, the signal LDRDL is kept at the high level in place of the pulse SELFOSC which is generated by the one-pulse generator 2, and the signal DETA for activating the $V_{BB}$ level sensor 5 is continuously generated. As a result, the $V_{BB}$ level sensor 5 monitors the $V_{BB}$ potential till the substrate voltage $V_{BB}$ reaches the set value VLT, and the charge pump circuit 7 is activated through the oscillator (OSC2) 6. Thus, each time the pulses OSC and OSCB are generated by the oscillator (OSC2) 6, the charge pump operation is performed to extract the substrate voltage $V_{BB}$ and the set value VLT is reached.

When the substrate voltage $V_{BB}$ reaches the set value VLT, the level detection signal DETA changes from the high level to the low level, and the output signal LDRDL of the OSC starting signal controller 3 is changed to change the output signal DETSW of the OSC controller 4 to the low level. As a result, the $V_{BB}$ level sensor 5 is inactivated, and the oscillation of the oscillator (OSC2) 6 is stopped. The charge pump circuit 7 performs the charge pump operation for the time delay after the aforementioned level is detected till the oscillator (OSC2) 6 is stopped, so that the substrate voltage $V_{BB}$ is slightly increased in absolute value. When the level detection signal DETA of the $V_{BB}$ level sensor 5 changes to the low level, the $V_{BB}$ level sensor 5 itself is inactivated. In the $V_{BB}$ level sensor 5, the level set value VLT need not be given special hysteresis characteristics. This makes it possible to simplify the circuit of the $V_{BB}$ level sensor 5.

The level detection signal DETA of the $V_{BB}$ level sensor 5 is set by the signal DETSW at the same level as that of the case in which it forcedly reaches the set $V_{BB}$ value in absolute value, as mentioned before. As a result, before the next timing at which the output pulse SELFOSC of the one-pulse generator 2 arrives, the OSC controller 4 is controlled by the signal LDRDL in accordance with the level of the signal SELFOSC, thereby to keep the signals DETSW and VBOSCSW in the aforementioned state. In short, the $V_{BB}$ level sensor 5 is inactivated, and the oscillator (OSC2) 6 and the charge pump circuit 7 are inactivated.

When the $V_{BB}$ level sensor 5 and the charge pump circuit 7 are inactivated, the substrate voltage $V_{BB}$ loses its current path, and a low current consumption operation is performed, but there arises a problem in that a potential fluctuation is liable to occur due to capacitative coupling with another power supply line. When the $V_{BB}$ level sensor 5 is activated according to the high level of the signal DETSW, the leakage current circuit 9 is turned off (inactivated). On the other hand, when the $V_{BB}$ level sensor 5 is inactivated according to the low level of the signal DETSW and the substrate voltage $V_{BB}$ loses the current path, the leakage current circuit 9 is turned on (inactivated).

Figure 4:
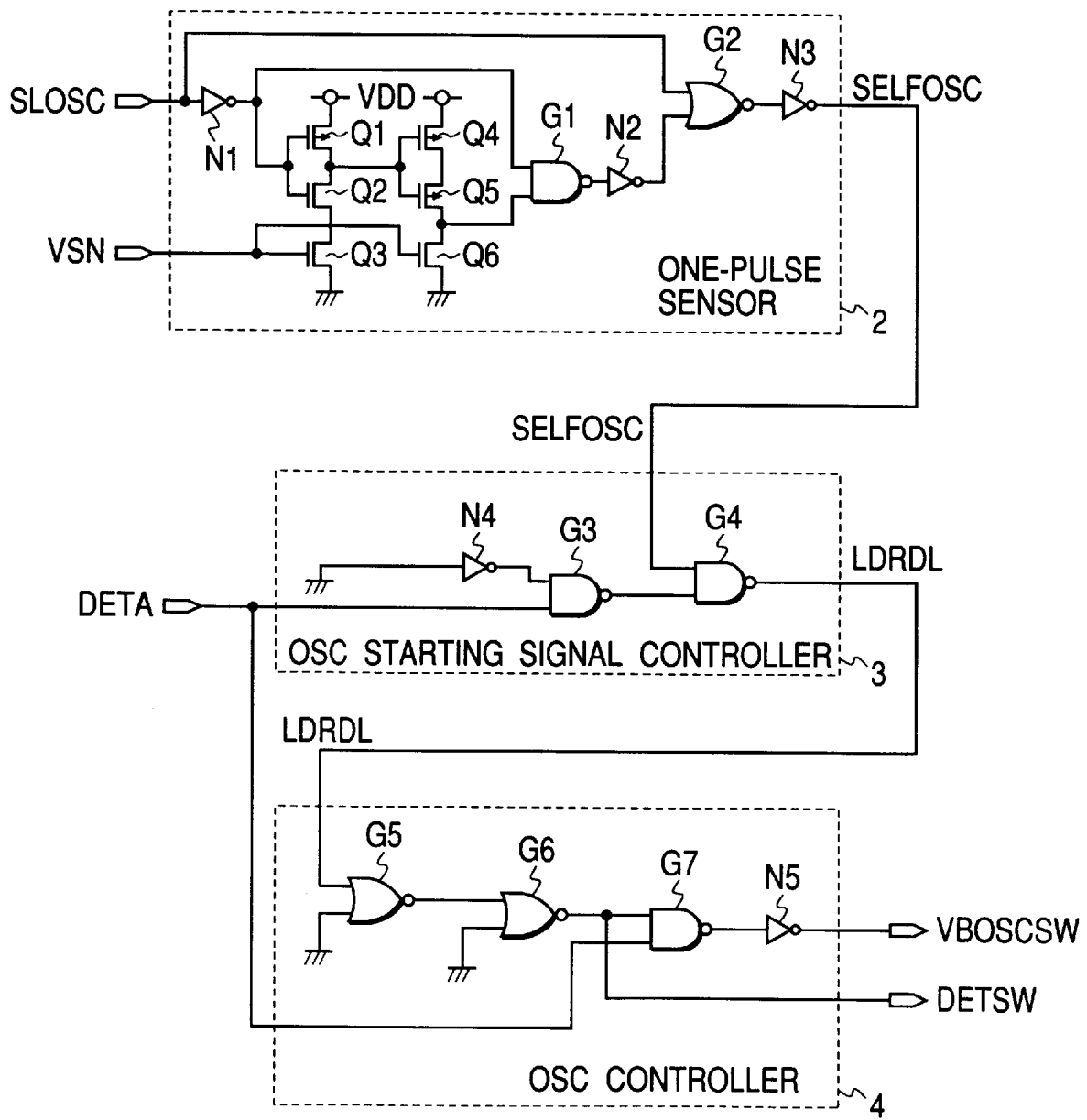
FIG. 4 is a circuit diagram showing one embodiment of a one-pulse generator 2, an OSC starting signal controller 3 and an OSC controller 4 of FIG. 1.

FIG. 4 is a circuit diagram showing one embodiment of the one-pulse generator 2, the OSC starting signal controller 3 and the OSC controller 4 of FIG. 1. In the following description, MOSFETS having a channel with an arrow, such as MOSFETs Q1 and Q4, are of the P-channel type. On the other hand, MOSFETs having a channel with no arrow, such as a MOSFET Q2, are of the N-channel type.

In order that the one-pulse generator 2 may generate the one pulse SELFOSC of a reduced width in synchronism with the oscillatory pulse SLOSC of a low frequency, a CMOS inverter comprising a P-channel MOSFET Q1 and an N-channel MOSFET Q2 is connected in cascade with an inverter comprising P-Channel MOSFETs Q4 and Q5 whose load is a constant current MOSFET Q6, constituting a delay circuit. In order to increase the delay time of the CMOS inverter, a constant current MOSFET Q3 is connected between the N-channel MOSFET Q2 and the ground potential of the circuit. A constant voltage VSN is applied between the gates and sources of the MOSPETs Q3 and Q6 which perform constant current operation.

The value of the constant current generated by the MOSFETs Q3 and Q6 is set at an extremely small value by either the value of the current fed to the current mirror circuit for generating the constant voltage VSN or the size ratio of the MOSFETs constituting the current mirror circuit. In the CMOS inverter comprising the MOSFETs Q1 and Q2, therefore, the discharge of the load capacitances comprising the input capacitances of the MOSFETs Q4 and Q5 at the next stage is delayed. This increases the delay time period for which the output signal changes from the high level to the low level when the input signal changes from the low level to the high level. In the inverter at the next stage, the P-channel MOSFETs Q4 and Q5 are connected in series thereby to delay the charge-up operation of the load capacitance and the discharge operation of the load capacitance of the constant current MOSFET Q6.

To the delay circuit described above, the oscillatory pulse SLOSC which is inverted through an inverter N1 is inputted.

The output signal of this inverter N1 is fed not only to the delay circuit but also to one input of a NAND gate circuit G1. The other input of this NAND gate circuit G1 is fed with the delay signal of the delay circuit. This NAND gate circuit G1 is equipped at its output with an inverter N2 so that the AND gate operation is performed by the NAND gate circuit G1 and the inverter N2. The oscillatory pulse SLOSC is fed to one input of a NOR gate circuit G2. This NOR gate circuit G2 is fed at its other input with the output signal of the inverter N2. The NOR gate circuit G2 is equipped at its output with an inverter N3. As a result, the OR gate operation is performed by the NOR gate circuit G2 and the inverter N3.

In this embodiment, according to the change of the oscillatory pulse SLOSC from the high level to the low level, the output signal SELFOSC is changed to the low level. That is, when the oscillatory pulse SLOSC is at the low level, the two input signals to the NAND gate circuit G1 take the low level, and the NAND gate generates the output signal at the low level. As a result, at the timing of the change of the oscillatory pulse SLOSC from the high level to the low level, the output signal SELFOSC is brought to the low level by the OR gate operation of the output unit.

When the oscillatory pulse SLOSC changes from the high level to the low level, the output signal of the inverter N1 changes from the low level to the high level. For the delay time period of the delay circuit by the MOSFETs Q1 to Q6, however, the other input of the NAND gate circuit G1 keeps the low level, so that the output signal of the inverter N2 is left at the low level. When the delay time elapses, both input signals to the NAND gate circuit G1 takes the high level and the output signal of the inverter N2 changes from the low level to the high level. As a result, the output signal SELFOSC also changes from the low level to the high level. According to the signal propagation delay time of the delay circuit, the gate circuit G1 and the inverter N2, therefore, the low-level period of the output SELFOSC is determined.

This OSC starting signal controller 3 comprises an inverter N4 and NAND gate circuits G3 and G4. The inverter N4 is fed at its input with the low level to generate a high level output signal steadily and feeds it to one input of the NAND gate circuit G3. This construction may be replaced by another construction in which the high level of the supply voltage or the like is fed to one input of the NAND gate circuit G3. The other input of the NAND gate circuit G3 is supplied with the level detection signal DETA of the $V_{BB}$ level sensor. The output signal of the NAND gate circuit G3 is fed to one input of the NAND gate circuit G4. This NAND gate circuit G4 is supplied at the other input with the signal SELFOSC to generate the control signal LDRDL to be fed from its output terminal to the OSC controller 4.

In this OSC starting signal controller 3, when the $V_{BB}$ level sensor is inactive, the substrate voltage $V_{BB}$ is forcedly set to the same level as the level which the set value VLT reaches, so that the output signal of the NAND gate circuit G3 is responsively set to the high level. In synchronism with the change to the low level of the signal SELFOSC from the one-pulse generator 2, therefore, there is generated the control signal LDRDL to be changed to the high level. If the level detection signal DETA from the $V_{BB}$ level sensor 5 is at the high level, which is not less than the set value VLT, the NAND gate circuit G3 changes to the low level thereby to keep the control signal LDRDL at the high level even if the time period set by the aforementioned delay circuit or the like elapses, and the signal SELFOSC from the one-pulse generator 2 returns to the high level. By this switching, the loop corresponding to the output signal of the $V_{BB}$ level sensor 5 is formed, and the aforementioned latching operation is performed until the substrate voltage $V_{BB}$ reaches the set value.

The OSC controller 4 comprises NOR gate circuits G5 and G6, a NAND gate circuit G7 and inverter N5. The NOR gate circuits G5 and G6 are steadily supplied with the low level at their one input. The other input of the NOR gate circuit G5 receives the control signal LDRDL. The output signal of the NOR gate circuit G5 is fed to the other input of the NOR gate circuit G6. This NOR gate circuit G6 generates from its output terminal the signal DETSW for controlling the operation of the $V_{BB}$ level sensor 5. The output signal of the NOR gate circuit G6 is fed to one input of the NAND gate circuit G7, the other input of which receives the level detection signal DETA of the $V_{BB}$ level sensor 5. The output signal of the NAND gate circuit G7 is outputted through the inverter N5 to generate the control signal VBOSCSW for controlling the oscillator (OSC2) 6.

In the OSC controller 4, when the signal LDRDL changes to the high level, the output signal of the NOR gate circuit G5 is set at the low level whereas the output signal of the NOR gate circuit G6 is set at the high level. These NOR gate circuits G5 and G6 operate substantially as an inverter. When the $V_{BB}$ level sensor 5 is activated by the high level of the output signal DETSW of the NOR gate circuit G6 to keep the level detection signal DETA at the low level, that is, when the substrate voltage $V_{BB}$ is higher in absolute value than the set value VLT, the NAND gate circuit G7 is kept at the high level whereas the signal VBOSCSW is kept at the low level, so that the oscillator (OSC2) 6 does not oscillate thereby to maintain the charge pump circuit 7 inactive. In this case, if the one-pulse SELFOSC of the one-pulse generator 2 returns to the high level, the signal LDRDL also takes the low level and the OSC controller 4 sets the signal DETSW to the low level thereby to inactivate the $V_{BB}$ level sensor 5.

When the $V_{BB}$ level sensor 5 is activated and the level detection signal DETA changes to the high level, that is, when it is determined that the substrate voltage $V_{BB}$ is lower in absolute value than the set value, the output signal of the NAND gate circuit G7 changes to the low level to raise the signal VBOSCSW to the high level. As a result, the oscillator (OSC2) 6 is brought into the oscillating state to generate the oscillatory pulse, which is rectified by the charge pump circuit 7 to extract the substrate voltage $V_{BB}$ in the negative direction. At this time, even if the one-pulse SELFOSC of the one-pulse generator 2 returns to the high level, the signal LDRDL is kept at the high level by the high level of the level detection signal DETA, and the OSC controller 4 keeps the $V_{BB}$ level sensor 5 active while keeping the signal DETSW at the high level. When the substrate voltage is lowered to the set value VLT by the operation of the charge pump circuit 7, the level detection signal DETA changes to the low level to change the signal LDRDL to the low level. In the OSC controller 4, the signal DETSW is changed to the low level to stop the operation of the $V_{BB}$ level sensor 5 and the operation of the oscillator (OSC2) 6 and the charge pump circuit 7.

The OSC controller 4 is equipped in the signal transmission path with the NOR gate circuits G5 and G6 serving as the delay circuit, and the NAND gate circuit G7 and the inverter N5 for generating the operation control signal VBOSCSW of the oscillator. Even if the level detection signal DETA changes from the high level to the low level, the oscillator (OSC2) 6 continues oscillation for the delay time attributed to the aforementioned signal transmission path, so that the extroperation to the negative voltage in the charge pump circuit 7 is kept larger than the set value VLT. The setting of this delay time and the intermittent operation of the $V_{BB}$ level sensor make it unnecessary to give hysteresis characteristics to the $V_{BB}$ level sensor.

Figure 5:
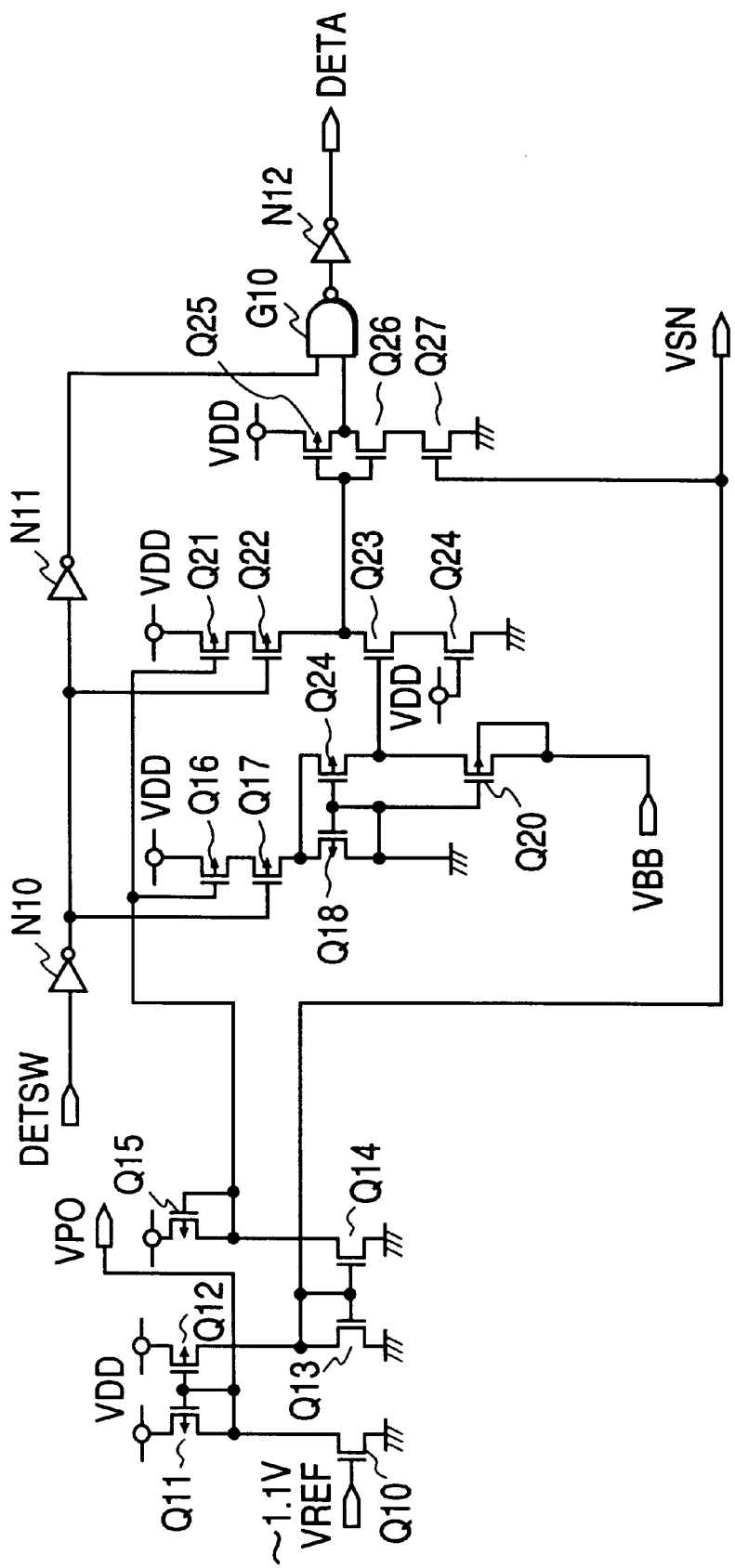
FIG. 5 is a circuit diagram showing one embodiment of a $V_{BB}$ level sensor 5 of FIG. 1.

FIG. 5 is a circuit diagram showing one embodiment of a $V_{BB}$ level sensor 5. The reference voltage VREF generated in a later-described reference voltage generator is applied between the gate and source of an N-channel MOSFET Q10. The constant current generated by this MOSFET Q10 is fed to a current mirror circuit comprising P-channel MOSFETs Q11 and Q12, to generate a constant voltage VPO for controlling a P-channel constant current MOSFET.

The drain current of the P-channel MOSFET Q12 is fed to a current mirror circuit comprising N-channel MOSFETs Q13 and Q14, to generate a constant current VSN for controlling an N-channel constant current MOSFET. This constant voltage VSN is also employed in the one-pulse generator 2 shown in FIG. 4. The drain current of the MOSFET Q14 is fed to a P-channel MOSFET Q15 in a diode form. Together with this MOSFET Q15, there are provided P-channel MOSFETs Q16 and Q21 in the current mirror form to set the operating currents of a level detector and an amplifier for amplifying the detection level.

The MOSFET Q16 is fed at its source with a supply voltage VDD and is equipped at its drain with a P-channel switch MOSFET Q17. Between this MOSFET Q17 and the ground potential of the circuit, there is connected a P-channel MOSFET Q18 which is operated as a resistive element by feeding its gate steadily with the ground potential. This MOSFET Q18 has a high ON resistance value. In parallel with this MOSFET Q18, there is connected a similar P-channel MOSFET Q19. Between the drain of this MOSFET Q19 and the substrate voltage $V_{BB}$, there is connected an N-channel MOSFET Q20. This MOSFET Q20 is steadily fed at its gate with the ground potential.

The N-channel MOSFET Q20 is fed at its gate with the ground potential, so that it is turned on to establish an electric current path when the source potential fed with the substrate voltage $V_{BB}$ is made lower than its threshold voltage. As the substrate voltage $V_{BB}$ lowers, the potential at the node between MOSFETs Q19 and Q20 lowers in accordance with the conductance ratio of the MOSFET Q20 and the P-channel MOSFET Q19. This detection signal is amplified by an amplifier which comprises MOSFETs Q21 to Q24. In short, the P-channel MOSFET Q21 operates as a constant current load, the P-channel MOSFET Q22 is a current switching element for operation control entailed by the intermittent operation, and the N-channel MOSFET Q23 supplied at its gate with the potential of the node constitutes an amplification element. The N-channel q24 is operated as a resistive element by supplying its gate with the supply voltage VDD and serves as a negative feedback element for the source of the amplifying MOSFET Q23.

The set value VLT is determined according to both the conductance ratio of the MOSFETs Q19 and Q20 and the logic threshold voltage of the aforementioned amplifier, and the output signal of the amplifier is employed as a binary signal for a CMOS inverter which comprises a P-channel MOSFET Q25 and an N-channel MOSFET Q26. This CMOS inverter (of Q25 and Q26) generates, as it is, a relatively high through current because the output signal of the amplifier cannot take a completely binary signal. In order to reduce this through current, the MOSFET Q26 is equipped with an N-channel MOSFET Q27. Since the gate of the MOSFET Q27 is supplied with the constant voltage VSN and consequently performs constant current operation, both the P-channel MOSFET Q25 and the N-channel MOSFET Q26 are turned on thereby to restrict the through current when amplification is performed.

The P-channel switch MOSFETS Q17 and Q22 provided in the current path of the $V_{BB}$ level sensor and in the current path of the amplifier respectively are supplied at their gates with the output signal of an inverter N10 receptive of the control signal DETSW. The output signal of the inverter N10 is inverted by an inverter N11 and is fed to one input of a NAND gate circuit G10 which is provided in an output section. The other input of the NAND gate circuit G10 receives the output signal of the CMOS inverter (Q25 and Q26). The NAND gate circuit G10 is equipped at its output with an inverter N12 to generate the level detection signal DETA.

When the control signal DETSW is at the low level, the output signal of the inverter N10 takes the high level to turn off the switch MOSFETs Q17 and Q22. As a result, no electric current flows in the $V_{BB}$ level sensor and the amplifier. When the control signal DETSW takes the low level, the output signal through the inverters N10 and N11 also takes the low level, so that the level detection signal DETA is fixed at the low level through the NAND gate circuit G10 and the inverter N12 provided in the output section. In short, when the $V_{BB}$ level sensor is inactive, the level of the level detection signal is controlled to the same level as that when the substrate voltage $V_{BB}$ is not higher than the set value VLT.

When the control signal DETSW is at the high level, the output signal of the inverter N10 takes the low level to turn on the switch MOSFETs Q17 and Q22. As a result, the $V_{BB}$ level sensor and the amplifier are operated to raise one input of the NAND gate circuit G10 provided in the output section to the high level, so that the output signal corresponding to the output signal through the $V_{BB}$ level sensor, the amplifier and the CMOS inverter is outputted as the level detection signal DETA. In short, when the substrate voltage $V_{BB}$ is higher than the set value VLT, that is, when the substrate voltage $V_{BB}$ is lower in absolute value than the target value, the potential of the $V_{BB}$ level sensor rises, is inverted and amplified to the low level by the amplifier, and this low level is amplified by the CMOS inverter to generate a binary signal at the high level. As a result, the level detection signal DETA is set at the high level.

According to the high level of the level detection signal DETA, the oscillator (OSC2) 6 and the charge pump circuit 8 are activated to extract the substrate voltage $V_{BB}$ to the negative potential side. As a result, when the substrate voltage $V_{BB}$ becomes lower than the set value VLT, that is, when the substrate voltage $V_{BB}$ is higher in absolute value than the target value, the potential of the $V_{BB}$ level sensor is lowered, inverted and amplified by the amplifier to generate the output signal at the high level. This output signal is amplified by the CMOS inverter to generate a binary signal at the low level. As a result, the level detection signal DETA changes to the low level to stop the operation of the oscillator 6 and the charge pump circuit 7.

Figure 6:
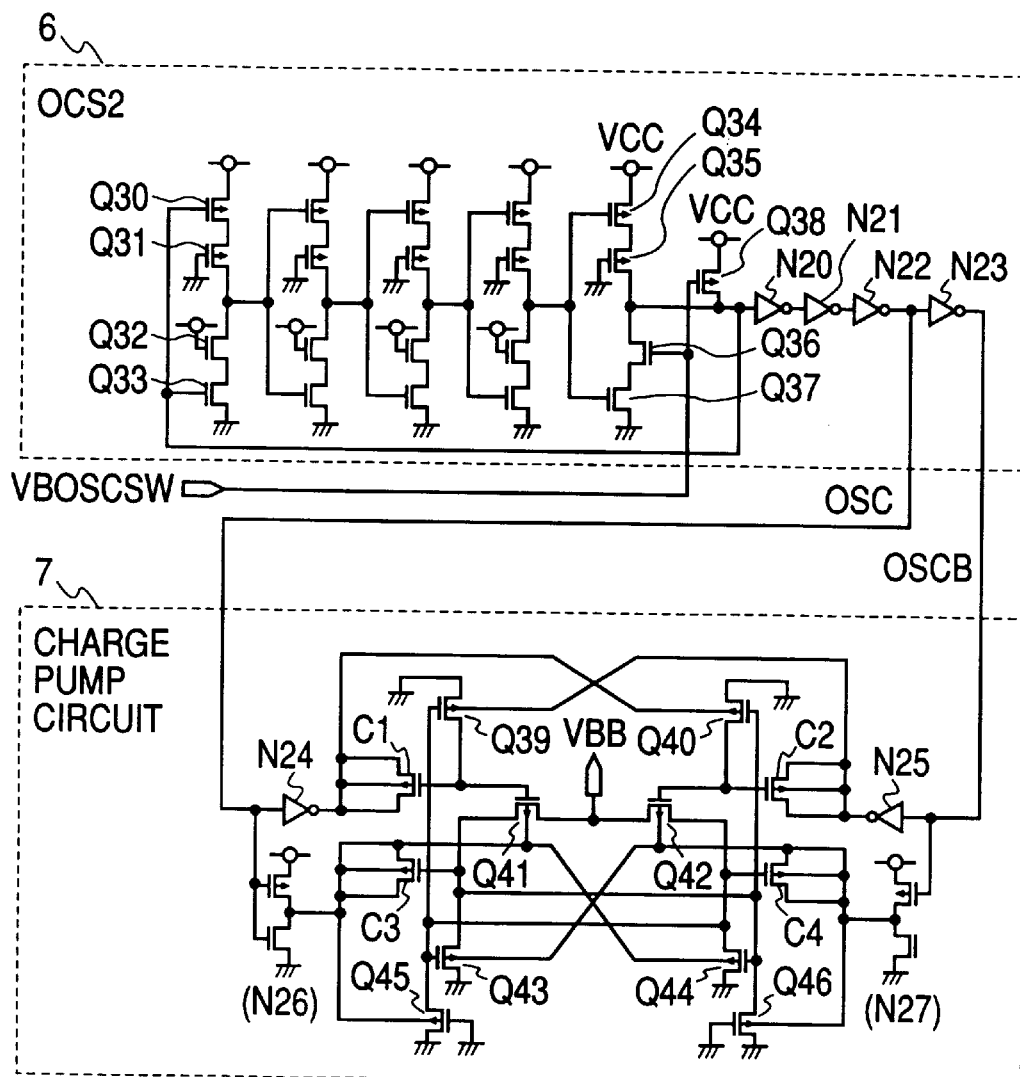
FIG. 6 is a circuit diagram showing one embodiment of a oscillator (OSC2) 6 and a charge pump circuit 7 of FIG. 1.

FIG. 6 is a circuit diagram showing one embodiment of the oscillator (OSC2) 6 and the charge pump circuit 7. The oscillator 6 employs a five-stage ring oscillator. In FIG. 6, only the MOSFETs of the initial stage circuit and the last stage circuit of the oscillator are designated by circuit symbols. In the initial stage circuit, a CMOS inverter comprising a P-channel MOSFET Q30 and an N-channel MOSFET Q33 is equipped with a P-channel MOSFET Q31, which is operated as a resistive element by applying ground potential, to its gate and an N-channel MOSFET Q32, which is operated as a resistive element by applying the supply voltage VDD, to its gate thereby to constitute a time constant circuit together with an input capacitor of the next stage. These circuits are connected in a five-stage ring, constituting an oscillatory circuit.

To allow intermittent operation of the oscillatory circuit in response to the control signal VBOSCSW, this control signal VBOSCSW is fed to the gate of an N-channel MOSFET Q36 which operates as a resistive element of the final stage circuit. Between the output terminal of the final stage circuit and the supply terminal VCC, there is connected a pull-up P-channel MOSFET Q38 which receives at its gate the control signal VBOSCSW. The ring oscillator is equipped at its output section with CMOS inverters N20 to N23. The inverter N23 is provided for generating the oscillatory pulse OSCB which is inverted in phase with respect to the oscillatory pulse OSC coming from the inverter N22.

When the control signal VBOSCSW is at the low level, the N-channel MOSFET Q36 is turned off whereas the P-channel MOSFET Q38 is turned on. As a result, the output signal of the final stage circuit is fixed to the high level such as the supply voltage VDD, so that the oscillating operation is stopped. At this time, the oscillatory output OSC is fixed to the low level whereas the oscillatory output OSCB is fixed to the high level. When the control signal VBOSCSW is raised to the high level, the MOSFET Q36 of the final stage circuit is turned on whereas the MOSFET Q38 is turned off, so that the five inverters are connected in cascade to start oscillation.

The charge pump circuit 7 of this embodiment comprises P-channel MOSFETs Q39 to Q46. These P-channel MOSFETs are formed in an N-well region. As a result, the N-well region can be electrically isolated from a P-well region to form memory cells, and minority carriers are produced in the N-well region during the charge pump operation, exerting no influence upon the memory cells formed in the P-well region.

A basic circuit of the pumping circuit for generating the negative voltage $V_{BB}$ is constructed of a capacitor C3 formed by utilizing the MOS capacitor, and the MOSFETs Q41 and Q43. A capacitor C4 and the MOSFETs Q42 and Q44 also constitute a similar basic circuit, but the phases of the pulses OSC and OSCB inputted are opposite to each other, and their active levels do not overlap mutually. As a result, the basic circuits alternately act in response to the input pulses, effecting highly efficient charge pumping operation.

The MOSFETs Q41 and Q43 may be basically connected in diode form, but, if so, level losses corresponding to their threshold voltages are caused. The MOSFETs do not substantially operate when the high level of the pulse signal OSC is as low as 3.3 V. Exploiting the fact that the MOSFET Q41 must be turned on only when the input pulse OSC is at the low level, therefore, an inverter N24 for generating a pulse similar to the input pulse, the capacitor C1 and the switch MOSFET Q39 are provided to generate a control voltage to be set at a negative value. As a result, the negative potential of the capacitor C3 can be transmitted without any level loss to the substrate voltage $V_{BB}$. The MOSFET Q39 is turned on when a negative voltage is generated in response to the other input pulse OSCB, charging up a capacitor C1. This capacitor C1 is one having a size small enough to generate the control voltage of the MOSFET Q41.

The MOSFET Q43 is turned off at a quick timing in response to the output signal at the high level of a driving inverter N27, which receives the other input pulse OSCB at its back gate (channel portion), making the extroperation of the substrate potential efficient. Likewise, the MOSFET Q41 is fed at its back gate with the output signal of the driving inverter N26, thereby turning off the MOSFET Q41 at a quick timing so as to charge up the capacitor C3. Hence the leakage of the substrate voltage $V_{BB}$ is minimized. The control signal fed to the gate of the MOSFET Q42 in response to the other input pulse OSCB and the back gate voltage of the MOSFETs Q44 and Q42 are also the pulse signal generated by the inverter N25 operating similarly and a capacitor C2 and the pulse signal generated on the basis of the input pulse OSC.

For extracting the gate voltages of the MOSFETs Q39 and Q43 (Q40 and Q44) at a quick timing, there is provided the MOSFET Q45 (Q46). This MOSFET Q45 (Q46) is connected into the diode form by connecting its gate and drain commonly, and is switched complementarily with the MOSFET Q43 (Q44) by feeding to its back gate the output signal of a driving inverter N26 (N27), which receives its own input pulse OSC (OSCB). As a result, when the output signal of the driving inverter N26 (N27) changes to the low level in response to the input pulse OSC (OSCB), the MOSFET Q43 (Q44) can be quickly changed to the OFF state from the ON, state so that the substrate voltage can be efficiently extracted to the negative potential.

Figure 7:
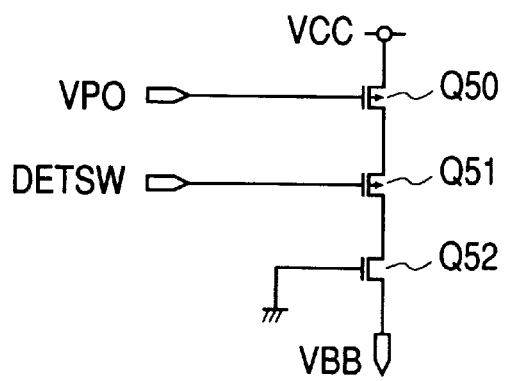
FIG. 7 is a circuit diagram showing one embodiment of a leakage current circuit 9 of FIG. 1.

FIG. 7 is a circuit diagram showing one embodiment of the leakage current circuit 9. In this circuit, P-channel MOSFETs Q50 and Q51 and an N-channel MOSFET Q52 are connected in series between the power supply voltage VDD and the substrate voltage $V_{BB}$. The MOSFET Q50 performs constant current operation in response to the constant voltage VPO fed to its gate. The leakage current circuit is provided for preventing the substrate voltage $V_{BB}$ from becoming unstable under the influence of the coupling from another power supply while the $V_{BB}$ level sensor and the charge pump circuit are inactive, so that the MOSFET Q51 is switched by the control signal DETSW. In short, the MOSFET Q51 is turned on to allow the leakage current to flow when the $V_{BB}$ level sensor is inactivated by the low level of the control signal DETSW.

Originally, the intermittent operation of the $V_{BB}$ level sensor is intended to reduce the current consumption. The significance of the intermittent operation of the $V_{BB}$ level sensor is lost if the current flowing through the leakage current circuit is as much as the current flowing through the substrate voltage $V_{BB}$ in the $V_{BB}$ level sensor. Therefore, the leakage current flowing from the leakage current circuit to the substrate voltage $V_{BB}$ is e.g., several microamperes, much lower than the level sense current flowing from the $V_{BB}$ level sensor to the substrate voltage $V_{BB}$.

Figure 8:
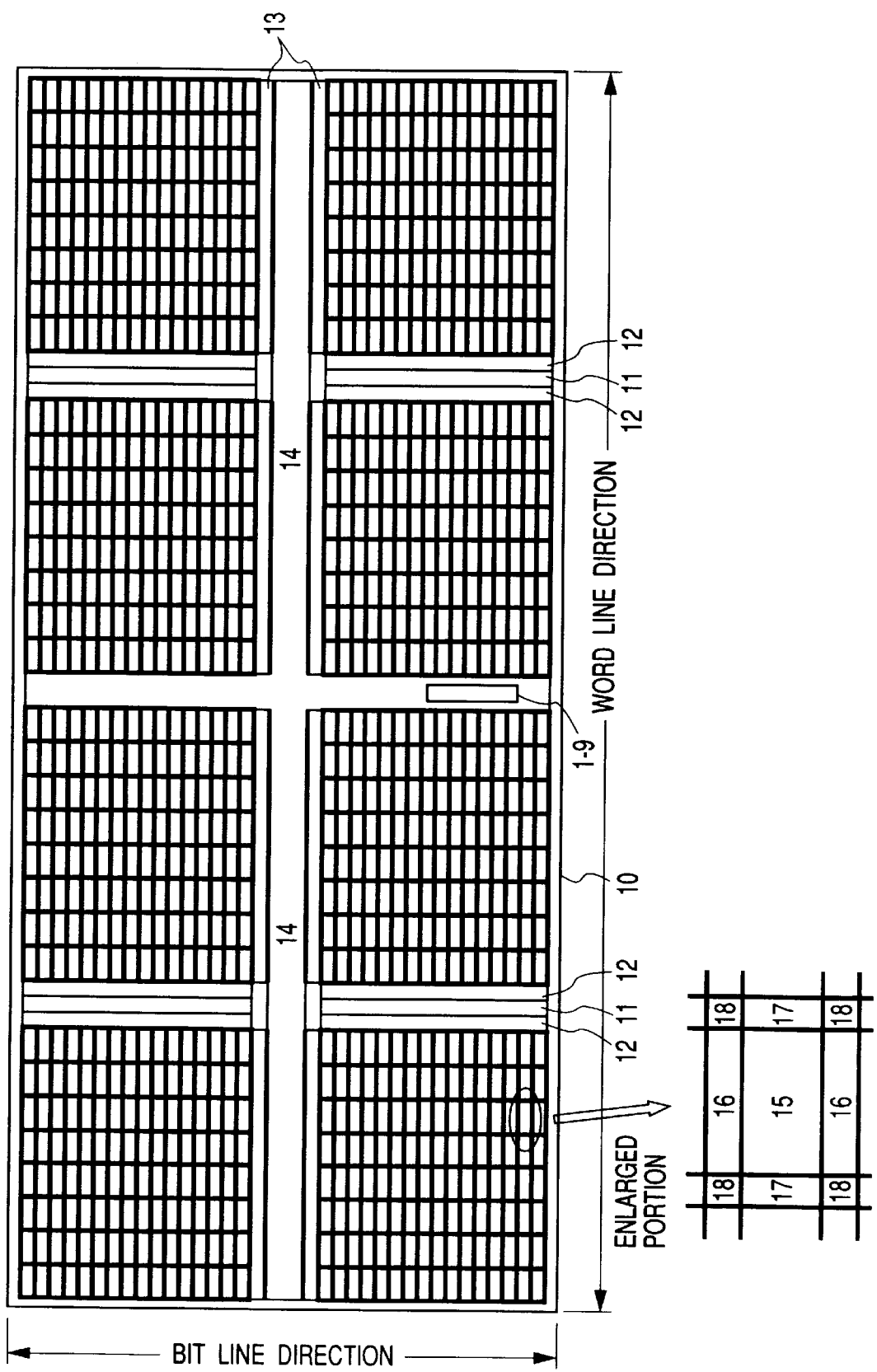
FIG. 8 is a schematic layout diagram showing one embodiment of a dynamic RAM to which the invention is applied.

FIG. 8 is a schematic layout view showing one embodiment of a dynamic RAM to which the invention is applied. The memory array is wholly divided into four. Two memory arrays are arranged at each of the left and right sides with respect to the longitudinal direction of a semiconductor chip, and a central portion 14 is equipped with an input/output interface circuit or the like comprising an address input circuit, a data input/output circuit and a bonding pad row. Column decoder regions 13 are arranged on both sides, in the portions adjacent to the memory arrays, of the central portion 14. One of the two central portions, divided with respect to the longitudinal direction, of the semiconductor chip is equipped with a substrate back bias voltage generator comprising the circuit blocks 1 to 9 of FIG. 1. A redundancy circuit for defect relief is provided on the side opposed to the substrate back bias voltage generator, although the invention is not especially limited thereto.

In the four memory arrays arranged two for left and right sides and two for upper and lower sides with respect to the longitudinal direction of the semiconductor chip, main row decoder regions 11 are provided at the vertically central portions with respect to the longitudinal direction. Above and below the main row decoder region 11, there are formed main word driver regions 12 for respectively driving the main word lines of the upper and lower divided memory arrays. As shown in an enlarged view, sense amplifier regions 16 and sub word driver regions 17 are formed on the sides of a memory cell array 15. The intersection between the sense amplifier regions and the sub word driver regions provide intersection regions 18. Sense amplifiers provided in the sense amplifier regions 16 are constructed by the shared sense method and are equipped, except for those arranged at the two ends of the memory cell array, with left and right complementary bit lines on both sides of the sense amplifier. They are selectively connected with the complementary bit lines of either of the left and right memory cell arrays.

The dynamic RAM of this embodiment is given a storage capacity of about 64M (Mega) bits. The memory arrays are wholly divided into eight, as described above. Four memory arrays are individually arranged in pairs on the left and right sides with respect to the longitudinal direction of the semiconductor chip. These two memory arrays arranged in pairs have a main word driver 12 arranged at their central portion. This main word driver 12 is provided correspondingly to the two memory arrays which are divided vertically on both sides thereof. The main word driver 12 generates a signal for selecting the main word lines which are extended through the one memory array. One memory array is connected, in the main word line direction, with a dynamic memory cell forming a storage capacity of 2 Kbits and, in the not-shown complementary bit line (or data line) direction perpendicular to the main word line direction, with a dynamic memory cell having a storage capacity of 4 Kbits. Eight of these memory arrays have a storage capacity as high as 8×2K×4K=64 Mbits as a whole.

One memory array is divided into eight memory blocks with respect to the main word line direction. Each memory block is equipped with the sub word driver 17. This sub word driver 17 is divided into a length of one-eighth with respect to the main word line to generate a signal for selecting the sub word lines extending in parallel with the main word lines. In this embodiment, in order to reduce the number of main word lines, namely, in order to mitigate the wiring pitch of the main word lines, four sub word lines are arranged for one main word line in the complementary bit line direction. In order to select one of the sub word lines thus divided into eight in the main word line direction, four assigned in each complementary bit line direction, there is provided a sub word selecting driver. This sub word line selecting driver generates a selection signal for selecting one of the four sub word selecting lines extending in the direction of the arrangement of the sub word drivers.

Taking one memory array as an example, in the sub word driver 17 which corresponds to one of the eight memory blocks assigned to one main word line which contains a memory cell to be selected, one sub word -selecting line is selected. As a result, one is selected from the sub word lines of 8×4=32 belonging to one main word line. Since a memory cell of 2 K (2,048) bits is provided in the main word line direction, as described above, one sub word line is connected with memory cells of 2,048/8=256. In a refreshing operation (say, in a self refresh mode), although the invention is not especially limited thereto, eight sub word lines corresponding to one main word line are brought into a selected state.

One memory array has a storage capacity of 4 k bits in the complementary bit line direction, as described above. If the memory cell of 4 k bits is connected with one complementary bit line, however, the parasitic capacity of the complementary bit line increases, and consequently a readable signal level cannot be achieved because of the capacitance ratio to that of the fine data storing capacitor, so that sixteen divisions are made in the complementary bit line direction. In other words, the complementary bit line is divided into sixteen by the sense amplifier 16 shown by thick solid lines. The sense amplifier 16 is constructed by the shared sense method, although the invention is not especially limited thereto, and the complementary bit lines, other than those arranged at the two ends of the memory array are arranged on the left and right sides of the sense amplifier 16 and are selectively connected with either the left or right complementary bit lines. Thus, the whole length of the bit lines connected with one sense amplifier 16 is doubled, and it can be deemed that the bit lines are divided into eight, when seen as the signal transmission path.

Figure 9:
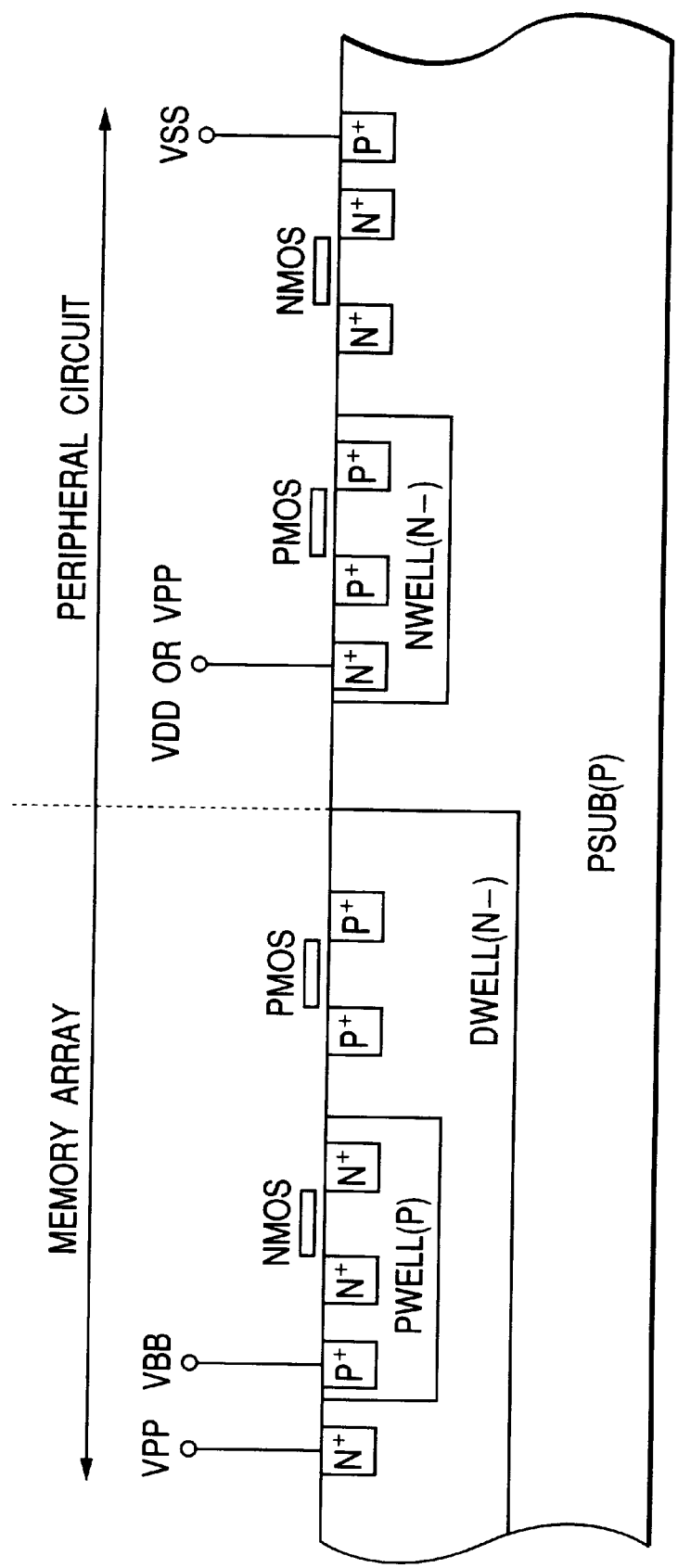
FIG. 9 is a schematic section view showing the structure of one embodiment of the dynamic RAM of FIG. 8.

FIG. 9 is a schematic section view showing the structure of one embodiment of the aforementioned dynamic RAM. FIG. 9 shows the memory array portion and its peripheral circuit portion schematically. The memory array portion is formed in an N-well region DWELL which is formed in a deep region. In this DWELL, there are formed the P-channel MOSFETs (PMOSs) of the circuit which relates to the memory array constituting the aforementioned sense amplifier and sub word driver. The portion where the dynamic memory cell is formed is in a P-well region PWELL which is formed in the region DWELL. This P-well region is supplied with the substrate voltage $V_{BB}$ which is generated in the aforementioned substrate back bias voltage generator.

In the DWELL forming the memory array portion, to gates of the N-channel MOSFETs (NMOSs) or the shared switch MOSFETs, there is applied a boosted voltage VPP which is boosted by the threshold voltage of the MOSFETs from the power supply voltage VDD. A signal at the level corresponding to the boosted voltage VPP is outputted through the MOSFETs which are formed in the region DWELL, so that the bias voltage applied to the region DWELL is also raised to a high voltage such as the boosted voltage VPP. On the contrary, the N-channel MOSFETs constituting the peripheral circuit are formed in a P-type substrate PSUB. Moreover, the P-channel MOSFETs are formed in an N-well region N-WELL which is formed in the substrate PSUB. The P-type substrate is supplied with the ground potential VSS of the circuit, and the region NWELL is supplied with the power supply voltage VDD.

In the dual well structure described above, the P-well region where the memory cells are formed is isolated from the P-type substrate, and the P-well region PWELL where the memory cells are formed is exclusively supplied with the negative substrate voltage $V_{BB}$. In this construction, by raising the effective threshold voltage of the address selecting MOSFETs constituting the dynamic memory cells, the leakage current when the word lines are brought to the nonselect level such as the low level can be reduced to increase the time period for which the data charge is held in the capacitors. Since the ground potential VSS of the circuit is fed to the substrate PSUB, the N-channel MOSFETs of the peripheral circuit have low threshold voltages, the current is larger if the size is the same, and the operating speed can be increased.

In the aforementioned construction, the P-well region PWELL where the memory cells are formed and the deep region DWELL are electrically isolated by the PN junction, creating a high parasitic capacitance. Therefore, the intermittent operation of the $V_{BB}$ level sensor of the substrate back bias voltage generator causes a problem in that a fluctuation of the boosted voltage VPP appears as a fluctuation of the voltage $V_{BB}$ in the inactive state. Therefore, the aforementioned leakage current circuit is provided, and the fluctuation of the voltage $V_{BB}$ can be minimized. Since the leakage current circuit allows an electric current of several microamperes to flow therethrough, the leakage current circuit need not be always operated complementarily with the $V_{BB}$ level sensor, and may be a circuit which steadily operates independently of the intermittent operation of the $V_{BB}$ level sensor.

Figure 10:
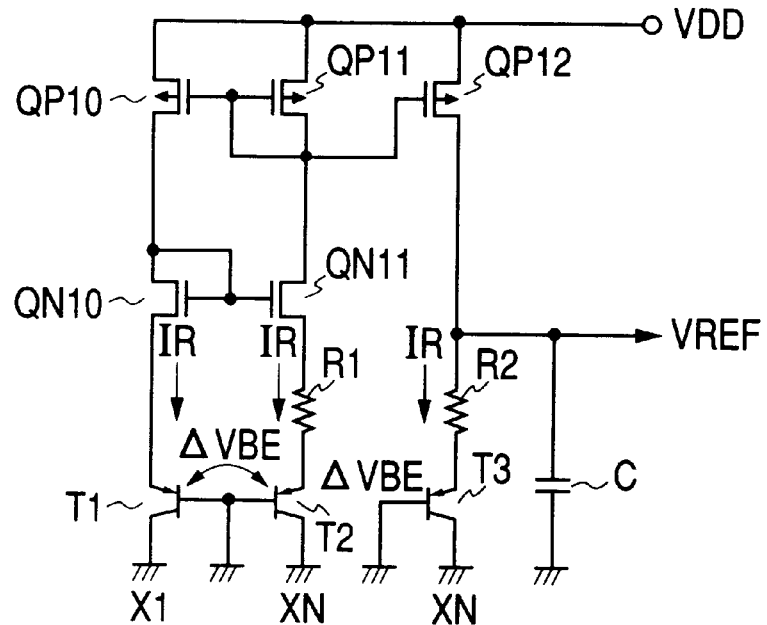
FIG. 10 is a circuit diagram showing one embodiment of a reference voltage generator 8 of FIG. 1.

FIG. 10 is a circuit diagram showing one embodiment of the reference voltage generator 8. In the reference voltage generator of this embodiment, the emitter current densities of PNP transistors T1, T2 are made different by making the emitter area ratios of the PNP transistors T1 and T2 different to feed them the same electric current IR. As a result, a constant voltage such as ΔVBE matching the silicon band gap is generated. In order to feed the same current IR to the transistors T1 and T2, there are provided P-channel MOSFETs QP10 and QP11 and N-channel MOSFETs QN10 and QN11. Specifically, the emitter potential of the transistor T1 is applied through the source-gate of the MOSFET QN10 and the gate-source of the MOSFET QN11 to one terminal of a resistor R1, the other terminal of which is connected with the emitter of the transistor T2. As a result, the constant voltage ΔVBE matching the silicon band gap is applied to the resistor R1, and the constant current IR flows.

The constant current IR is fed to the emitter of the transistor T1 through the MOSFET QN11, a current mirror circuit comprising P-channel MOSFETS QP10 to QP12, and the N-channel MOSFET QN10. The current IR is further fed through the P-channel MOSFET QP12 to a resistor R2 to generate the constant voltage VREF. To the other terminal of the resistor R2, there is provided a transistor T3 which is given the same size as that of the transistor T2 to compensate the temperature, so that the base-to-emitter voltage is applied. The reference voltage generator is equipped at its output terminal with a capacitor C for stabilizing the reference constant voltage VREF. Since the stabilized constant voltage VREF is thus generated, the current setting of the $V_{BB}$ level sensor and the leakage current circuit can be controlled high precision, the power consumption can be reduced, and the operation can be stabilized.

Figure 11:
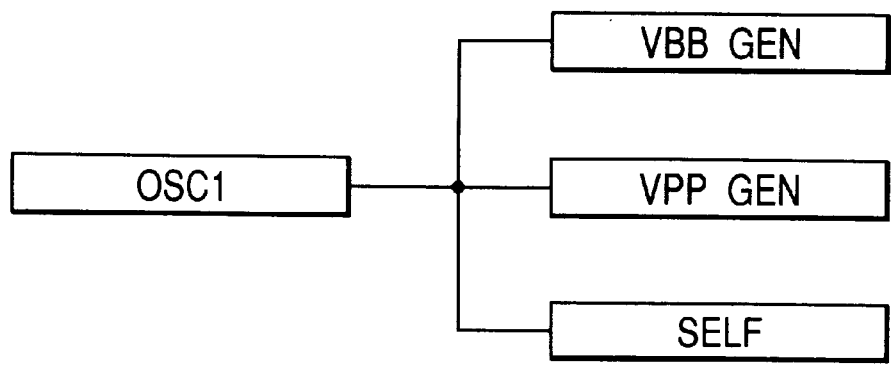
FIG. 11 is a schematic block diagram showing another embodiment of the voltage generator according to the invention.

FIG. 11 is a schematic block diagram showing another embodiment of the invention. In this embodiment, an oscillator OSC1 for controlling the intermittent operation of the $V_{BB}$ level sensor is utilized for another circuit. Specifically, the oscillatory pulse of the oscillator OSC1 is fed not only to a reference voltage generator $V_{BB}$ Gen comprising the $V_{BB}$ level sensor, the controller, the oscillator and the charge pump circuit, but also to a boosted voltage generator VPP Gen and a refresh controller SELF.

When the dynamic RAM is brought into a standby state, the boosted voltage generator VPP Gen rectifies the pulse coming from the oscillator OSC1 and having a low frequency, to generate the boosted voltage. As a result, a boosting operation is so performed so as to compensate the drop, caused by the leakage current, of the VPP voltage. When the dynamic RAM comes into the active state to start the memory access, the oscillator, contained in the boosted voltage generator VPP Gen and having a high frequency, is activated to perform the boosting operation. The refresh controller SELF generates the oscillatory pulse of the oscillator OSC1 so as to update the address for the refreshing operation or to determine the refresh period.

Figure 12:
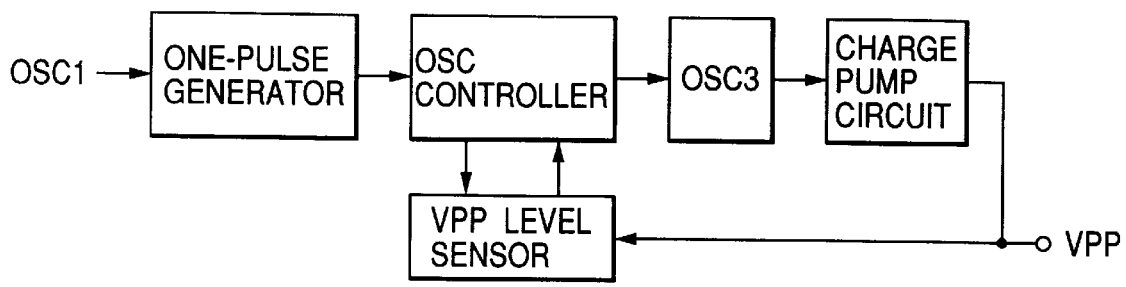
FIG. 12 is a block diagram showing one embodiment in which the invention is applied to a boosted voltage generator.

FIG. 12 is a block diagram showing one embodiment of the case in which the invention is applied to the boosted voltage generator. In this embodiment, the pulse of low frequency, generated by the oscillator OSC1, is shortened in width by the one pulse generator to start the $V_{BB}$ level sensor through the OSC control signal. If the output of the started $V_{BB}$ level sensor is not more than the desired boosted voltage, the OSC starter activates an oscillator OSC3 thereby to activate the charge pump circuit for the voltage boosting operation. When the boosted voltage VPP is raised to the desired boosted voltage by the $V_{BB}$ level sensor, the oscillation of the oscillator OSC3 is stopped.

The boosted voltage generator described above is activated when the dynamic RAM having the boosted voltage generator is in the standby state. Specifically, the boosted voltage generator generates the level for selecting the word lines and the level for selecting the shared selection MOSFETs, and therefore the aforementioned intermittent operation is inappropriate for the memory access because the potential change is great in the word line selecting operation. At this memory access, therefore, it is practical to keep the boosted voltage by activating a separately provided oscillator to activate the charge pump circuit.

Figure 13:
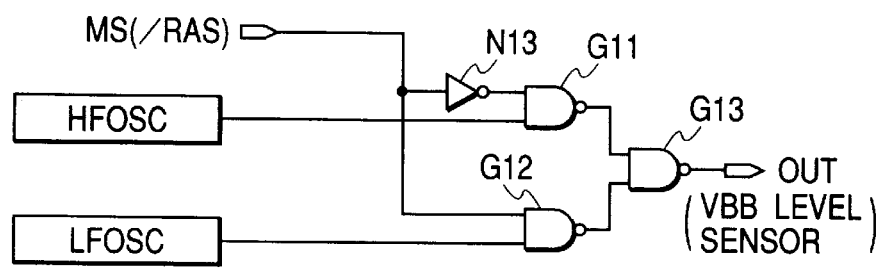
FIG. 13 is a block diagram showing another embodiment for illustrating a method of starting the substrate back bias voltage generator according to the invention.

FIG. 13 is a block diagram showing another embodiment for illustrating a method of starting the substrate back bias voltage generator according to the invention. In this embodiment, there are provided two oscillators HFOSC and LFOSC. The oscillator HFOSC is made to have a relatively high oscillatory frequency which is raised considering the fluctuation in the substrate voltage at the memory access time. On the other hand, the oscillator LFOSC is made to have a frequency as low as about 100 KHz, considering the fluctuation in the substrate voltage in the standby state.

The oscillatory pulses, generated by the two oscillators HFOSC and LFOSC, are fed to respective inputs of NAND gate circuits G11 and G12. The other input of the NAND gate circuit G11 is supplied with a mode control signal MS (e.g., a row address strobe signal /RAS) through an inverter N13. The other input of the NAND gate circuit G12 is supplied with a mode control signal MS.

In this construction, when the mode control signal MS (the row address strobe signal /RAS in the example of the dynamic RAM) ordering the memory access is set at the low level, the output signal of the NAND gate circuit G12 is fixed to the high level independently of the oscillatory pulse of the low frequency coming from the oscillator LFOSC. The NAND gate circuit G11 receives the control signal at the high level through the inverter N13, so that it outputs an oscillatory pulse of high frequency from the oscillator HFOSC. As a result, a NAND gate circuit G13, which receives the output signals of the two NAND gate circuits G11 and G12, generates a pulse output OUT corresponding to the high frequency. This pulse OUT is fed to the one-pulse generator and is utilized as the signal for starting the $V_{BB}$ level sensor.

When the memory is in the standby state, the mode control signal MS (the row address strobe signal /RAS in the example of the dynamic RAM) is set at the high level, and the output signal of the NAND gate circuit G12 outputs an oscillatory pulse of low frequency from the oscillator LFOSC. The NAND gate circuit G11 is supplied with the control signal at the low level through the inverter N13 and it outputs the high level independently of the oscillatory pulse of the high frequency from the oscillator HFOSC. As a result, the pulse output OUT corresponding to the low frequency is generated from the NAND gate circuit G13, which receives the outputs of the two NAND gate circuits G11 and G12. This pulse PUT is fed to the one-pulse generator and utilized as the signal for starting the $V_{BB}$ level sensor.

By thus generating two kinds of starting signal in accordance with the operation mode, the substrate voltage at the memory access time and the substrate voltage at the standby time can be generated at an optimum condition, thereby stabilizing the substrate voltage and reducing the current consumption by the substrate back bias voltage generator.

Figure 14:
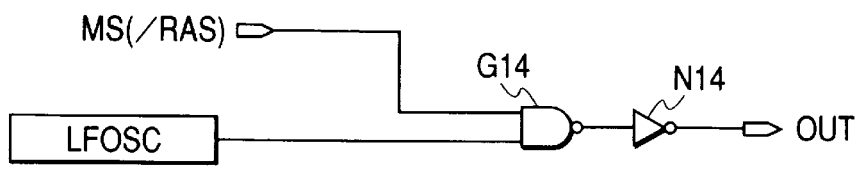
FIG. 14 is a block diagram showing another embodiment for illustrating a method of starting the substrate back bias voltage generator according to the invention.

FIG. 14 is a block diagram showing another embodiment for illustrating a method of starting the substrate back bias voltage generator according to the invention. In this embodiment, the operation is switched at the standby time it is switched to the intermittent operation by the oscillator LFOSC to osillate at low frequency and at memory access time to the continuous operation. In short, the oscillatory pulse, generated by the oscillator LFOSC, is fed to one input of a NAND gate circuit G14. The other input of this NAND gate circuit G14 receives the mode control signal MS (the row address strobe signal RAS in the example of the dynamic RAM). Moreover, the output signal of the NAND gate circuit G14 is outputted as the output signal OUT through an inverter N14.

In the construction described above, in the standby state, the control signal MS (/RAS) is at the high level, and the NAND gate circuit G14 is opened to pass the pulse of the low frequency and the pulse is outputted through the inverter N14. This pulse OUT is fed to the aforementioned one-pulse generator and is utilized as the signal for starting the $V_{BB}$ level sensor. In short, the aforementioned intermittent operation is performed by the $V_{BB}$ level sensor. At the memory access time, on the other hand, the control signal MS (/RAS) is set at the low level. As a result, the NAND gate circuit G14 fixes the output OUT to the high level independently of pulse of the low frequency. As a result, the intermittent operation of the $V_{BB}$ level sensor is stopped. Although not shown, moreover, the $V_{BB}$ level sensor is continuously operated by the low level of the signal MS.

Figure 15:
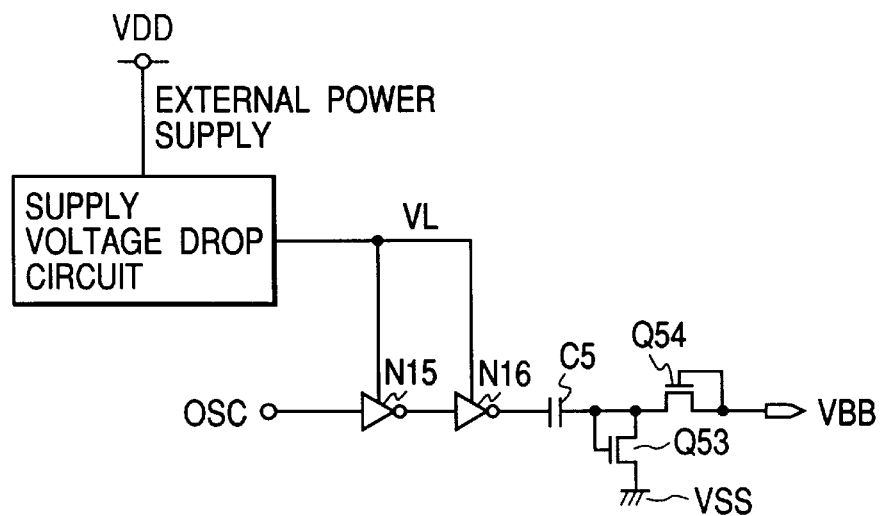
FIG. 15 is a block diagram showing another embodiment of the substrate back bias voltage generator according to the invention.

FIG. 15 is a block diagram showing another embodiment of the substrate back bias voltage generator according to the invention. In this embodiment, by making use of the fact that a DC current is generated by the charge transfer of the capacitor in the charge pump circuit, the operating voltage is lowered to a constant voltage so that the maximum voltage to be generated by the charge pump circuit may be the set voltage of the substrate back bias voltage. In other words, the external power supply voltage VDD is lowered by a voltage lowering circuit to a constant voltage VL to shape the waveform of the pulse and to activate inverter circuits N15 and N16 constituting a drive circuit. By transmitting the oscillatory pulse OSC through those inverters, there is generated a pulse whose high level corresponds to the lowered voltage VL.

A capacitor C5 and MOSFETs Q53 and Q54 in diode form constitute the charge pump circuit and charge up the capacitor C5 to VL-Vth (Vth is the threshold voltage of the MOSFET Q53) when the output signal of the inverter N16 is at the high level VL. When the output signal of the inverter N16 is at the low level (0 V), a negative voltage like -(VL-Vth) is generated from the capacitor C5 and is transmitted through the MOSFET Q54 to the substrate $V_{BB}$. At this time, level loss is caused by the threshold voltage Vth of the MOSFET Q54, so that the maximum voltage transmitted to the substrate $V_{BB}$ is changed to -(VL-2Vth). If the value of -(VL-2Vth) is designed to be slightly higher than the set voltage value of the substrate voltage $V_{BB}$ by considering the efficiency of the charge pump circuit, it does not become lower than the aforementioned voltage even if the charge pump circuit is continuously operated.

In the substrate back bias voltage generator of this embodiment, the $V_{BB}$ level sensor can be eliminated. This $V_{BB}$ level sensor makes the substrate voltage constant but, in another aspect, it can be deemed to be a circuit for preventing the substrate voltage $V_{BB}$ from exceeding the set value in the absolute value in the charge pump circuit. The reason why the operation of the charge pump circuit is stopped by the $V_{BB}$ level sensor is that the voltage $V_{BB}$ must be prevented from becoming excessively lower and the useless current must be suppressed in the charge pump operation. If, therefore, the voltage $V_{BB}$ is prevented from exceeding the set value even if the charge pump circuit is continuously operated as in the embodiment, the $V_{BB}$ level sensor can be eliminated, simplifying the operation control of the substrate back bias voltage generator.

If the maximum voltage of the charge pump circuit and the substrate voltage $V_{BB}$ are equalized, no charge transfer between the capacitor C5 and the substrate voltage $V_{BB}$ occurs with no current consumption. However, current consumption occurs in the charge and discharge in the oscillator and the inverter N15. At the standby time, therefore, the oscillatory frequency of the oscillatory pulse OSC is lowered. At the memory access time, the oscillatory frequency of the oscillatory pulse OSC is raised. In other words, the frequency switching is not performed by the gate circuit as in the embodiment of FIG. 13 but may be performed by switching the operation of the two oscillators HFOSC and LFOSC.

Figure 16:
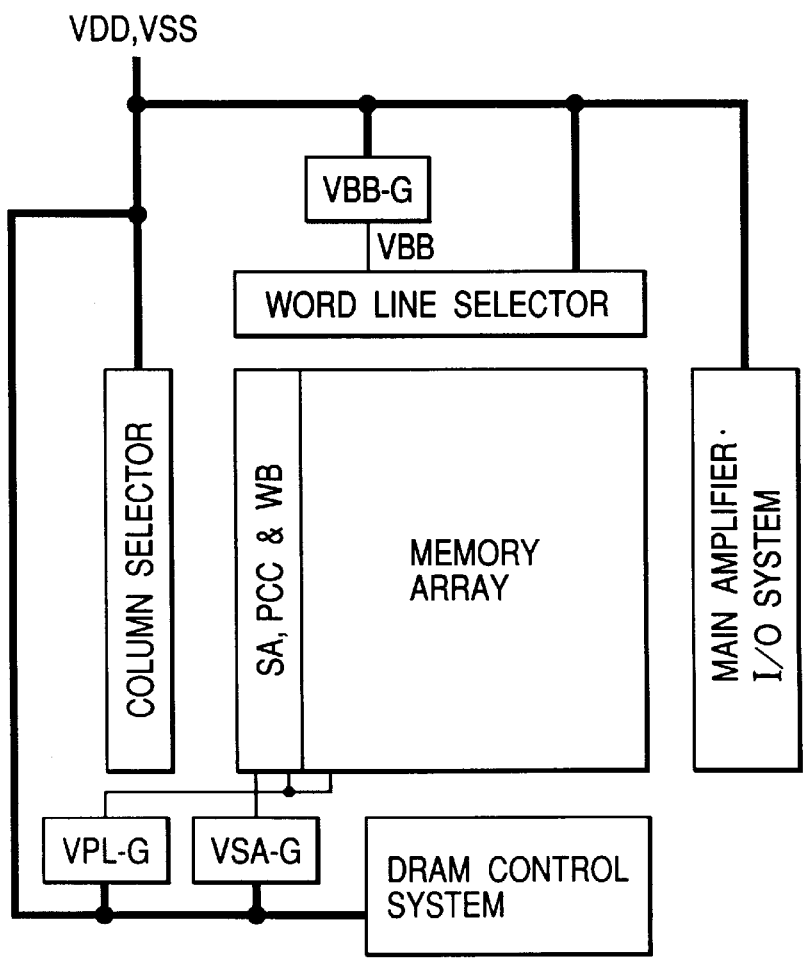
FIG. 16 is a schematic block diagram showing one embodiment of a dynamic RAM according to the invention.

FIG. 16 is a schematic block diagram showing one embodiment of the dynamic RAM according to the invention. The power supply voltage such as the power supply voltage VDD from the external terminal or the ground potential VSS of the circuit is fed to a column selector, a word line selector, a main amplifier I/O system and a DRAM control system. The power supply voltage is further fed to three kinds of internal voltage generator. A negative voltage generator VBB-G is a circuit similar to the substrate back bias voltage generator of the foregoing embodiment, and comprises an oscillator, like a ring oscillator of the foregoing embodiment, receptive of the power supply voltage VDD and the ground potential VSS of the circuit, and a charge pump circuit for generating a negative voltage in response to the oscillatory pulse. In order to stabilize the negative voltage and to suppress wasteful current consumption, there is provided a controller for performing the charge pump operation intermittently by sensing the level of the substrate voltage.

An internal voltage generator VSA-G generates a voltage by shifting the power supply voltage VDD by the level of the threshold voltage of the MOSFETs and can be basically constructed of a source follower circuit of N-channel MOSFETS. A voltage generator VPL-G generates a precharge voltage of the bit lines and a plate voltage VPL. This voltage generator VPL-G generates a voltage by shifting the power supply voltage VDD by the level of the threshold voltage of the MOSFETs, and generates a voltage by dividing the former voltage into one half. The precharge voltage and the plate voltage VPL may be made common because they can be equal in level, but are so outputted through different drivers that they do not influence each other.

The negative voltage $V_{BB}$, generated by the negative voltage generator VBB-G, is fed to the word line selector.

The precharge voltage is used in a precharge circuit PCC, and the plate voltage VPL is transmitted to the common electrode (plate) of the capacitor of the memory cell. An internal voltage VSA is fed as the operating voltage of a sense amplifier SA and a write buffer WB. In this construction, not the back bias voltage $V_{BB}$ at the negative potential but the voltage VSS of 0 V is applied to the P-well region for forming the memory array.

In the dynamic RAM of this embodiment, the select level corresponding to the power supply voltage and the nonselect level corresponding to a lower negative level than the ground potential of the circuit are fed to the word lines which are connected with the gates of the address selecting MOSFETs of the dynamic memory cells, and the signal of the memory cells, read out and outputted to the complementary bit lines, is amplified by the sense amplifier which is operated by the internal voltage generated by lowering the power supply voltage by the threshold voltage of the address selecting MOSFETs, and the ground potential of the circuit.

This construction makes it possible to eliminate the supply of the substrate back bias voltage to the P-well region or P-type substrate where the memory cells are formed, and to make the dual well structure where the deep region DWELL is formed in the region where the memory array shown in FIG. 9 is formed, thereby simplifying the process. The word line select level may employ the voltage VPP which is boosted with respect to the supply voltage. In this case, the sense amplifier may be operated by the power supply voltage and the ground potential of the circuit.

The following effects can be achieved by the foregoing embodiments.

(1) The first periodic pulse is rectified to generate the internal voltage by the charge pump circuit; the level detector is provided for detecting whether or not the internal voltage reaches the desired level; the charge pump circuit is controlled by the controller in accordance with the detection signal so that the internal voltage may take the desired level; and the switch element to be switched by the second periodic pulse is provided in the current path of the level detector thereby to form the leakage current path for allowing a lower electric current than the electric current to flow through the former current path. As a result, the internal voltage is not undesirably lowered by the electric current flowing through the level detector, so that the current consumption can be reduced as a whole, and the internal voltage can be stabilized when the level detector is inactivated.

(2) When the switch element determines that the detected signal of the level detector is lower in absolute value than the desired level, the controller generates the control signal for keeping the switch element on till the detected signal reaches the desired level. As a result, the voltage can be rationally generated matching the internal voltage.

(3) The first periodic pulse is generated by the first oscillator, the oscillation of which is controlled according to the detected signal of the level detector thereby to substantially control operation of the charge pump circuit. As a result, the oscillator can be intermittently operated to minimize its current consumption to the necessary level.

(4) The second periodic pulse is generated by the second oscillator which is oscillated with a lower frequency than that of the first periodic pulse. As a result, the active period of the level detector can be substantially shortened to reduce the electric current for generating the second periodic pulse, so that the power consumption is reduced.

(5) The second periodic pulse is inputted to reduce the pulse duty of the one-shot pulse generator. As a result, the active period of the level detector can be shortened to reduce the power consumption drastically.

(6) In series with the current path for detecting the level of the level detector, there is connected the constant current source MOSFET for the constant current operation in response to the reference voltage, so that the level detection signal generated in the current path is amplified by the amplifier, the active current of which is restricted by a constant current source MOSFET similar to the aforementioned one. As a result, the level can be stably detected while reducing the electric current drastically.

(7) When the semiconductor integrated circuit device is kept in the inactive state, the switch element is turned on by the second periodic pulse. As a result, the current consumption in the inactive state can be effectively reduced.

(8) The switch element is turned on by the second periodic pulse when the semiconductor integrated circuit device is kept in the inactive state, but is steadily kept on when the same is in the active state. As a result, the internal voltage can be stabilized with low consumption of power in the inactive state, and stabilized correspondingly to the operation in the active state.

(9) The second switch element is turned on by the second periodic pulse when the semiconductor integrated circuit device is kept in the inactive state, but is turned on by the third periodic pulse having a shorter period than that of the second periodic pulse when the semiconductor integrated circuit device is active. As a result, the internal voltage can be stabilized with low power consumption in both the inactive and active states.

(10) The negative bias voltage fed to the P-well region, where the memory array constructed of the dynamic memory cells which comprise the address selecting MOSFETS and the storage capacitor is provided in the matrix shape, is generated by the charge pump circuit. As a result, the substrate back bias voltage can be stabilized with low power consumption.

(11) The nonselect level of the word lines, which are connected with the gates of the address selecting MOSFETs constituting the dynamic memory cells, is generated by the charge pump circuit. As a result, the P-well region or P-type substrate where the address selecting MOSFETs are formed can be set at 0 V, simplifying the process.

(12) There is provided in the leakage current path the switch element switched complementarily with the switch element which is provided in the current path of the level detector. As a result, the current flowing through the leakage current path can be minimized to the necessary level.

(13) The P-well region having the memory array is formed in the deep N-well region. To this N-well region, there is applied the boosted voltage corresponding to the select level of the word lines which are connected with the gates of the address selecting MOSFETs of the dynamic memory cells formed in the memory cell array. Then, the voltage fluctuation due to the coupling with the boosted voltage can be prevented by the leakage current path.

(14) The charge pump circuit is employed as the first circuit for generating the negative bias voltage fed to the P-well region where the memory array is provided, in which the dynamic memory cells comprising the address selecting MOSFETs and the storage capacitor are arranged in a matrix, and as the second circuit for generating the select level of the word lines which are connected with the gates of the address selecting MOSFETs constituting the dynamic memory cells. As a result, the voltages of the individual circuits can be generated with low power consumption.

(15) The power supply voltage fed from the external terminal is lowered by the voltage lowering circuit to generate the desired constant voltage and thereby to activate the pulse outputting circuit for outputting the periodic pulse, and the charge pump circuit generates the internal voltage by rectifying the pulse which is outputted from the pulse outputting circuit. The level of the internal voltage is determined by combining the level of the lowered voltage, the frequency of the pulse and the efficiency of the charge pump circuit. As a result, the internal voltage can be set at the desired level without providing the level detector.

Although our invention has been specifically described in connection with various embodiments, it should not be limited thereto but could naturally be modified in various manners without departing from the gist thereof. For example, the specific construction of the level detector can take a variety of modes or forms to match the internal voltage to be generated. To make the substrate voltage $V_{BB}$ deeper in the embodiment of FIG. 5, for example, it is only necessary to connect the N-channel MOSFET in the diode form in series with the MOSFET Q20 or to change the logic threshold value of the amplifier. The charge pump circuit utilizes oscillatory pulses of mutually opposite phases in the embodiment of FIG. 6 to generate the negative voltage, but various modes can be adopted by employing a construction using only one pulse or a simple circuit as shown in FIG. 15.

The invention can be applied not only to the aforementioned dynamic RAM but also widely to various semiconductor integrated circuit devices having an internal voltage generator for generating an internal voltage different from the voltage fed from an external terminal, such as an internal voltage of negative level or an internal voltage boosted with respect to the power supply voltage, by utilizing a charge pump circuit.

Here will be briefly described the effects obtained by a representative feature disclosed herein. Specifically, a first periodic pulse is rectified to generate an internal voltage by a charge pump circuit; a level detector is provided for detecting whether or not the internal voltage reaches a desired level; the charge pump circuit is controlled by a controller in accordance with the detection signal so that the internal voltage may take the desired level; and a switch element switched by the second periodic pulse is provided in the current path of the level detector. As a result, the internal voltage is not undesirably lowered by the electric current flowing through the level detector, so that the current consumption can be reduced as a whole.

What is claimed is:

1. A semiconductor integrated circuit device comprising:
   a charge pump circuit which receives a first periodic pulse and which generates an internal voltage;
   a level detector which detects whether or not the level of said internal voltage reaches a predetermined value;
   a controller which controls the operation of said charge pump circuit on the basis of the output signal of said level detector;
   the level detector comprising a first switch element provided in a first current path through which an operation current of said level detector flows, and which is switched by a second periodic pulse, wherein one terminal of said first current path is connected to the output terminal of said charge pump circuit; and
   a second switch element provided in a second current path formed between a power supply voltage terminal and the output terminal of said charge pump circuit, wherein the second switch element receives an input from the second current path, and the electric current flowing through said second current path is smaller than the electric current flowing through said first current path.

2. A semiconductor integrated circuit device according to claim 1, wherein said first switch element and said second switch element are complementarily switched.

3. A semiconductor integrated circuit device according to claim 1, wherein when it is decided that the detection signal of said level detector is lower in the absolute value than said desired level, said first switch element is kept on until said detection signal reaches said desired level.

4. A semiconductor integrated circuit device according to claim 3, further comprising:
   a first oscillator,
   wherein said first periodic pulse is generated by said first oscillator, and the operation of said charge pump circuit is controlled by controlling the oscillation of said first oscillator in accordance with the detection signal of said level detector.

5. A semiconductor integrated circuit device according to claim 4, further comprising:
   a second oscillator,
   wherein said second periodic pulse is generated by said second oscillator which is oscillated by a lower frequency than that of said first periodic pulse.

6. A semiconductor integrated circuit device according to claim 5, further comprising:
   a one-shot pulse generator,
   wherein said second periodic pulse is inputted to said one-shot pulse generator to reduce its pulse duty.

7. A semiconductor integrated circuit device according to claim 1, wherein said first switch element is turned on with said second periodic pulse when said semiconductor integrated circuit device is kept in an inactive state.

8. A semiconductor integrated circuit device according to claim 1, wherein said first switch element is turned on with said second periodic pulse when said semiconductor integrated circuit device is kept in an inactive state, and is steadily kept on when said semiconductor integrated circuit device is in an active state.

9. A semiconductor integrated circuit device according to claim 1, wherein said first switch element is turned on with said second periodic pulse when said semiconductor integrated circuit device is kept in an inactive state, and is kept on with a third periodic pulse having a shorter period than that of said second periodic pulse when said semiconductor integrated circuit device is in an active state.

10. A semiconductor integrated circuit device according to claim 1, 2 or 3, wherein said charge pump circuit generates a negative bias voltage fed to a P-well region where a memory array is formed, in which dynamic memory cells comprising address selecting MOSFETs and a storage capacitor are arranged in a matrix shape.

11. A semiconductor integrated circuit device according to claim 1, 2 or 3, wherein said charge pump circuit generates a nonselect level of word lines which are connected with the gates of address selecting MOSFETs constituting dynamic memory cells, and wherein a P-well region or P-type substrate where said address selecting MOSFETs are formed is fed with ground voltage as a bias voltage.

12. A semiconductor integrated circuit device according to claim 1, 2 or 3, wherein a P-well region having said memory array is formed in an N-well region, and wherein said N-well region is fed with a boosted voltage corresponding to the select level of word lines which are connected to the gates of address select MOSFETs of dynamic memory cells formed in said memory cell array.

13. A semiconductor integrated circuit device according to claim 1, 2 or 3, wherein said charge pump circuit includes a first circuit which generates a negative bias voltage fed to a P-well region where a memory array is provided, in which dynamic memory cells comprising address selecting MOSFETs and a storage capacitor are arranged in a matrix; and a second circuit which generates the select level of word lines which are connected to the gates of the address selecting MOSFETs constituting said dynamic memory cells.

14. A semiconductor integrated circuit device comprising:

a charge pump circuit which receives a first periodic pulse and which generates an internal voltage;

a level detector which detects whether or not the level of said internal voltage reaches a predetermined value;

a controller which controls the operation of said charge pump circuit on the basis of the output signal of said level detector;

the level detector comprising a first switch element which feeds an operation current intermittently to said level detector, wherein said first switch element is switched with a second periodic pulse; and a second switch element receives an input from the second current path, and the second switch element connected between the output terminal of said charge pump circuit and a power supply voltage terminal for feeding a lower current than said operation current intermittently, wherein said second switch element is on when said first switch element is off.

15. A semiconductor integrated circuit device according to claim 14, wherein when it is decided that the detection signal of said level detector is lower in absolute value than said desired level, said first switch element is kept on until said detection signal reaches said desired level.

16. A semiconductor integrated circuit device according to claim 14, further comprising:

a first oscillator, wherein said first periodic pulse is generated by said first oscillator, and the substantial operation of said charge pump circuit is controlled by controlling the oscillation of said first oscillator in accordance with the detection signal of said level detector.

17. A semiconductor integrated circuit device according to claim 16, further comprising:

a second oscillator, wherein said second periodic pulse is generated by said second oscillator which is oscillated by a lower frequency than that of said first periodic pulse.

18. A semiconductor integrated circuit device according to claim 17, further comprising:

a one-shot pulse generator, wherein said second periodic pulse is inputted to said one-shot pulse generator to reduce its pulse duty.

19. A semiconductor integrated circuit device comprising:

a charge pump circuit which receives a first periodic pulse and which generates an internal voltage;

a level detector including a first current path for feeding an electric current between a node fed with said internal voltage and a power supply terminal, and adapted to detect whether or not the level of said internal voltage reaches a predetermined value;

a controller which controls said internal voltage to a desired level by controlling the of said charge pump circuit in accordance with the output signal of said level detector;

a switch element provided in said current path of said level detector and switched with a second periodic pulse; and a second current path provided between a node fed with said internal voltage and a predetermined node for feeding a lower electric current than the electric current flowing through the first current path of said level detector.

20. A semiconductor integrated circuit device according to claim 19, wherein said controller generates a control signal for keeping on said switch element until the detection signal of said level detector reaches said desired level, when said switch element decides that said detection signal is lower in the absolute value than said desired level.

21. A semiconductor integrated circuit device according to claim 19 or 20, wherein said first periodic pulse is generated by a first oscillator, and the substantial operation of said charge pump circuit is controlled by controlling the oscillation of said first oscillator in accordance with the detection signal of said level detector.

22. A semiconductor integrated circuit device according to claim 19, wherein said second periodic pulse is generated by a second oscillator which is oscillated by a lower frequency than that of said first periodic pulse.

23. A semiconductor integrated circuit device according to claim 19 or 22, wherein said second periodic pulse is inputted to a one-shot pulse generator to reduce its pulse duty.

24. A semiconductor integrated circuit device according to claim 19, wherein a first constant current source MOSFET which performs constant current operation in response to a reference voltage is connected in series with a first current path for detecting the level of said level detector, and wherein the level detection signal generated by said first current path is amplified by an amplifier, the operation current of which is restricted by a second constant current source MOSFET.

25. A semiconductor integrated circuit device according to claim 19 or 20, wherein said switch element is turned on with said second periodic pulse when said semiconductor integrated circuit device is kept in an inactive state.

26. A semiconductor integrated circuit device according to claim 19 or 20, wherein said switch element is turned on with said second periodic pulse when said semiconductor integrated circuit device is kept in an inactive state, and steadily kept on when said semiconductor integrated circuit device is in an active state.

27. A semiconductor integrated circuit device according to claim 19 or 20, wherein said switch element is turned on with said second periodic pulse when said semiconductor integrated circuit device is kept in an inactive state, and turned on with a third periodic pulse having a shorter period than that of said second periodic pulse when said semiconductor integrated circuit device is in an active state.

28. A semiconductor integrated circuit device according to claim 25, wherein said charge pump circuit generates a negative bias voltage fed to a P-well region where a memory array is provided, in which dynamic memory cells comprising address selecting MOSFETs and a storage capacitor are arranged in a matrix shape.

29. A semiconductor integrated circuit device according to claim 25, 26 or 27, wherein said charge pump circuit generates a nonselect level of word lines which are connected to the gates of address selecting MOSFETs constituting dynamic memory cells, and wherein a P-well region or P-type substrate where said address selecting MOSFETs are formed is fed with ground voltage as a bias voltage.

30. A semiconductor integrated circuit device according to claim 19, wherein a switch element switched complementarily with the switch element provided in the first current path of said level detector is provided in said second current path.

31. A semiconductor integrated circuit device according to claim 30, wherein a P-well region where said memory array is provided is formed in the N-well region, and wherein said N-well region is fed with a boosted voltage corresponding to the select level of word lines which are connected with the gates of address select MOSFETS of dynamic memory cells formed in said memory cell array.

32. A semiconductor integrated circuit device according to claim 25, 26 or 27, wherein said charge pump circuit includes a first circuit which generates a negative bias voltage fed to a P-well region where a memory array is provided, in which dynamic memory cells comprising address selecting MOSFETs and a storage capacitor are arranged in a matrix; and a second circuit which generates the select level of word lines which are connected to the gates of the address selecting MOSFETs constituting said dynamic memory cells.

33. A semiconductor integrated circuit device according to claim 26, wherein said charge pump circuit generates a negative bias voltage fed to a P-well region where a memory array is provided, in which dynamic memory cells comprising address selecting MOSFETs and a storage capacitor are arranged in a matrix shape.

34. A semiconductor integrated circuit device according to claim 27, wherein said charge pump circuit generates a negative bias voltage fed to a P-well region where a memory array is provided, in which dynamic memory cells comprising address selecting MOSFETs and a storage capacitor are arranged in a matrix shape.

35. A semiconductor integrated circuit device according to claim 26, wherein said charge pump circuit generates a nonselect level of word lines which are connected to the gates of address selecting MOSFETs constituting dynamic memory cells, and wherein a P-well region or P-type substrate where said address selecting MOSFETs are formed is fed with ground voltage as a bias voltage.

36. A semiconductor integrated circuit device according to claim 27, wherein said charge pump circuit generates a nonselect level of word lines which are connected to the gates of address selecting MOSFETs constituting dynamic memory cells, and wherein a P-well region or P-type substrate where said address selecting MOSFETs are formed is fed with ground voltage as a bias voltage.

37. A semiconductor integrated circuit device according to claim 26, wherein said charge pump circuit includes a first circuit which generates a negative bias voltage fed to a P-well region where a memory array is provided, in which dynamic memory cells comprising address selecting MOSFETs and a storage capacitor are arranged in a matrix; and a second circuit which generates the select level of word lines which are connected to the gates of the address selecting MOSFETs constituting said dynamic memory cells.

38. A semiconductor integrated circuit device according to claim 27, wherein said charge pump circuit includes a first circuit which generates a negative bias voltage fed to a P-well region where a memory array is provided, in which dynamic memory cells comprising address selecting MOSFETs and a storage capacitor are arranged in a matrix; and a second circuit which generates the select level of word lines which are connected to the gates of the address selecting MOSFETs constituting said dynamic memory cells.

* * * * *